United States Patent
Saito et al.

(10) Patent No.: US 11,761,075 B2
(45) Date of Patent: Sep. 19, 2023

(54) SUBSTRATE CLEANING APPARATUS

(71) Applicant: TOKYO ELECTRON LIMITED, Tokyo (JP)

(72) Inventors: Yukimasa Saito, Yamanashi (JP); Toshiki Hinata, Yamanashi (JP); Kazuya Dobashi, Yamanashi (JP); Kyoko Ikeda, Yamanashi (JP); Shuji Moriya, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1398 days.

(21) Appl. No.: 15/781,242

(22) PCT Filed: Oct. 25, 2016

(86) PCT No.: PCT/JP2016/081550
§ 371 (c)(1),
(2) Date: Jun. 4, 2018

(87) PCT Pub. No.: WO2017/098823
PCT Pub. Date: Jun. 15, 2017

(65) Prior Publication Data
US 2018/0355465 A1    Dec. 13, 2018

(30) Foreign Application Priority Data
Dec. 7, 2015    (JP) .................. 2015-238283

(51) Int. Cl.
*H01L 21/67* (2006.01)
*C23C 14/02* (2006.01)
(Continued)

(52) U.S. Cl.
CPC .............. *C23C 14/022* (2013.01); *A47L 5/14* (2013.01); *B08B 5/00* (2013.01); *B08B 13/00* (2013.01);
(Continued)

(58) Field of Classification Search
CPC ... C23C 14/022; C23C 14/021; C23C 14/505; C23C 14/564; C23C 16/02;
(Continued)

(56) References Cited

U.S. PATENT DOCUMENTS

| | | | | |
|---|---|---|---|---|
| 2012/0247670 A1* | 10/2012 | Dobashi | ............ | H01L 21/67028 156/345.31 |
| 2014/0352737 A1* | 12/2014 | Ookouchi | ......... | H01L 21/67051 134/30 |
| 2015/0052702 A1* | 2/2015 | Dobashi | ............ | H01L 21/67028 15/303 |

FOREIGN PATENT DOCUMENTS

| | | | | |
|---|---|---|---|---|
| CN | 101559428 A | * | 10/2009 | |
| CN | 104078398 A | * | 10/2014 | ....... H01L 21/67161 |

(Continued)

OTHER PUBLICATIONS

Machine translation of CN 104289463 (Year: 2015).*
(Continued)

*Primary Examiner* — Erin F Bergner
(74) *Attorney, Agent, or Firm* — WEIHROUCH IP

(57) ABSTRACT

A substrate cleaning apparatus that cleans a processing target substrate by blasting the gas clusters to the processing target substrate. The apparatus includes: a chamber configured to accommodate the processing target substrate; a rotary stage configured to rotatably support the processing target substrate in the chamber; an blasting unit configured to blast the gas clusters to the processing target substrate supported by the rotary stage; a driving unit configured to scan a gas cluster-blasted position on the processing target substrate; an exhaust port configured to evacuate the chamber; and a control mechanism configured to control a scattering direction of particles by controlling a rotation direction of the processing target substrate by the rotary stage and a scanning direction of the gas cluster-blasted position, (Continued)

thereby suppressing re-adhesion of the particles to the processing target substrate.

32 Claims, 22 Drawing Sheets

(51) Int. Cl.
*H01L 21/687* (2006.01)
*C23C 16/458* (2006.01)
*C23C 16/44* (2006.01)
*C23C 16/02* (2006.01)
*A47L 5/14* (2006.01)
*B08B 13/00* (2006.01)
*B08B 5/00* (2006.01)
*H01L 21/304* (2006.01)
*C23C 14/50* (2006.01)
*C23C 14/56* (2006.01)
*H01L 21/02* (2006.01)

(52) U.S. Cl.
CPC .......... *C23C 14/021* (2013.01); *C23C 14/505* (2013.01); *C23C 14/564* (2013.01); *C23C 16/02* (2013.01); *C23C 16/0227* (2013.01); *C23C 16/4401* (2013.01); *C23C 16/4412* (2013.01); *C23C 16/4584* (2013.01); *H01L 21/02041* (2013.01); *H01L 21/304* (2013.01); *H01L 21/67017* (2013.01); *H01L 21/6719* (2013.01); *H01L 21/67028* (2013.01); *H01L 21/68714* (2013.01); *H01L 21/68764* (2013.01); *H01L 21/68785* (2013.01); *B08B 2205/00* (2013.01)

(58) Field of Classification Search
CPC ............ C23C 16/0227; C23C 16/4401; C23C 16/4412; C23C 16/4584; A47L 5/14; B08B 5/00; B08B 13/00; B08B 2205/00; H01L 21/02041; H01L 21/304; H01L 21/67017; H01L 21/67028; H01L 21/6719; H01L 21/68714; H01L 21/68764; H01L 21/68785; H01L 21/67259; H01L 21/68721
See application file for complete search history.

(56) References Cited

FOREIGN PATENT DOCUMENTS

| | | |
|---|---|---|
| CN | 104289463 A | 1/2015 |
| JP | 2013-26327 A | 2/2013 |
| JP | 2014-67979 A | 4/2014 |
| JP | 2015-023138 A | 2/2015 |
| JP | 2015-26745 A | 2/2015 |
| JP | 2015-41646 A | 3/2015 |
| JP | 2015-65396 A | 4/2015 |
| TW | 201424936 A | 7/2014 |
| TW | 201505727 A | 2/2015 |

OTHER PUBLICATIONS

Machine translation of CN-101559428 (Year: 2009).*
Machine translation of CN-104078398 (Year: 2014).*
International Search Report dated Jan. 17, 2017 in PCT/JP2016/081550.

* cited by examiner

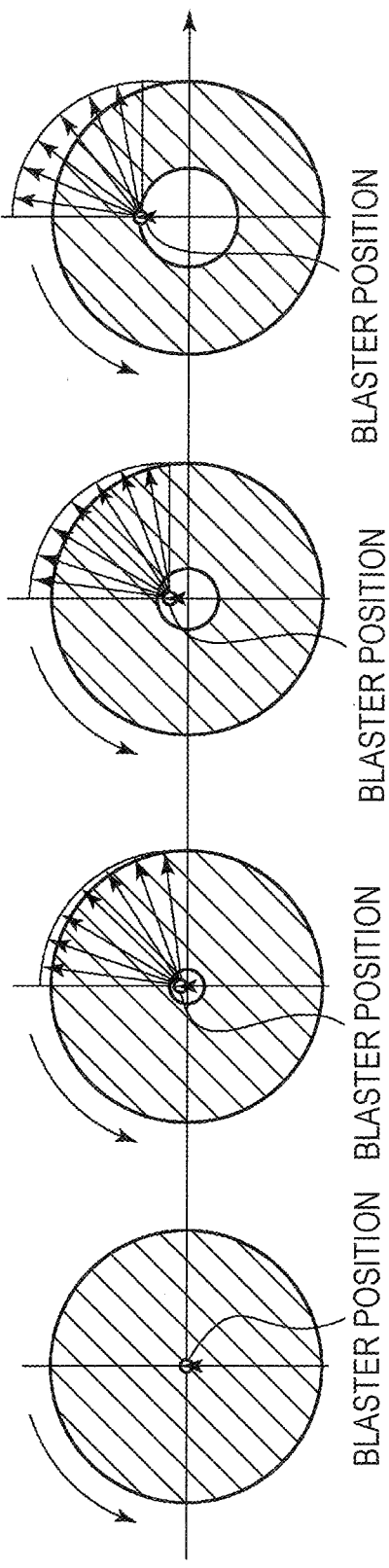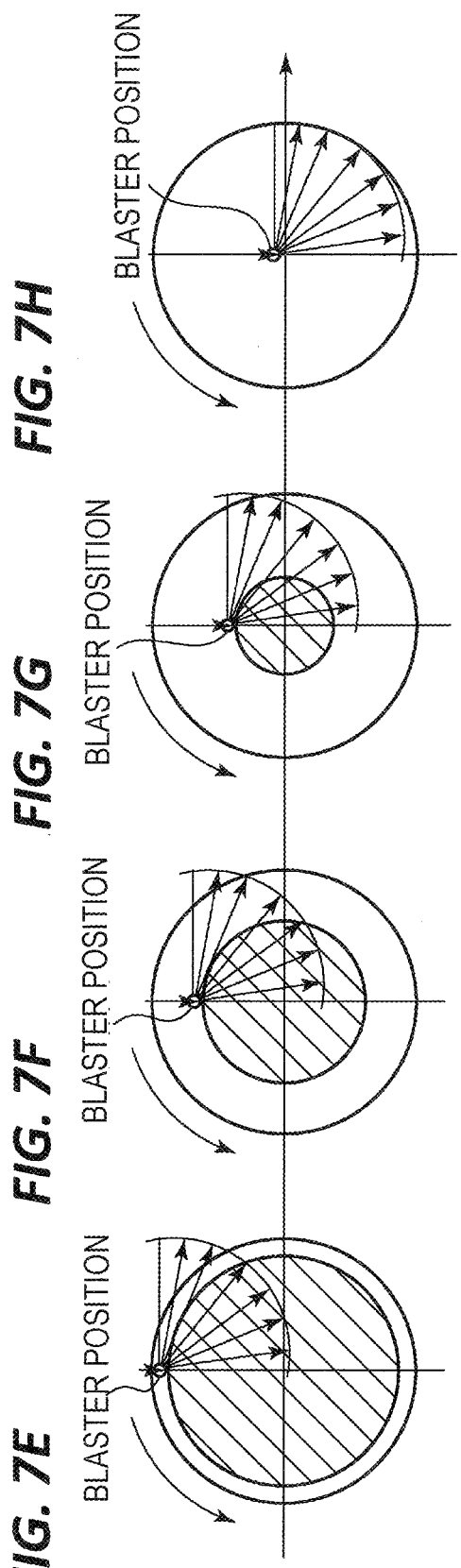

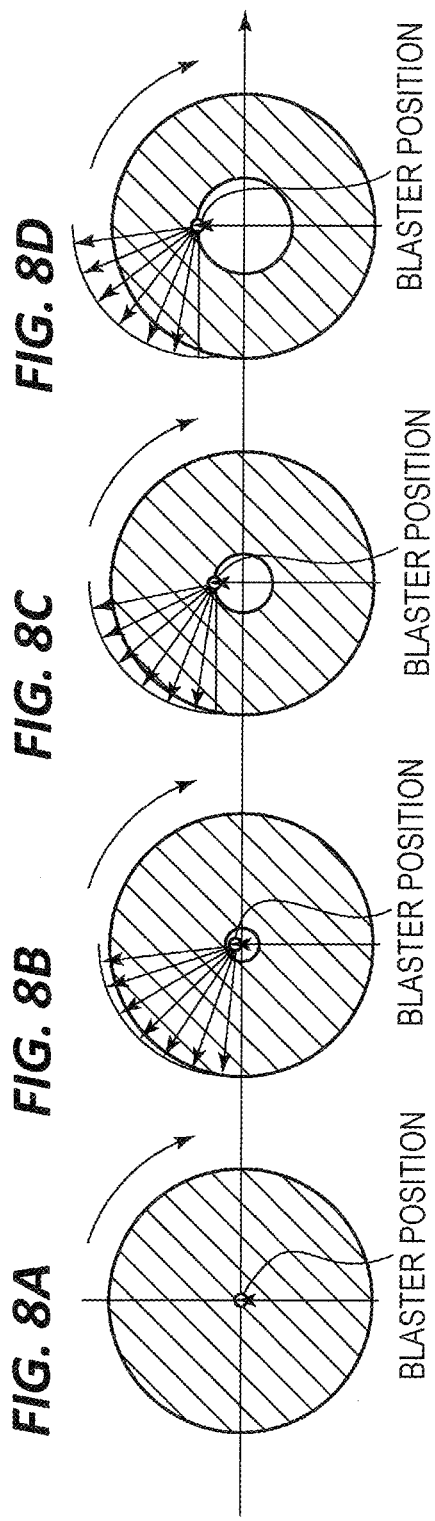
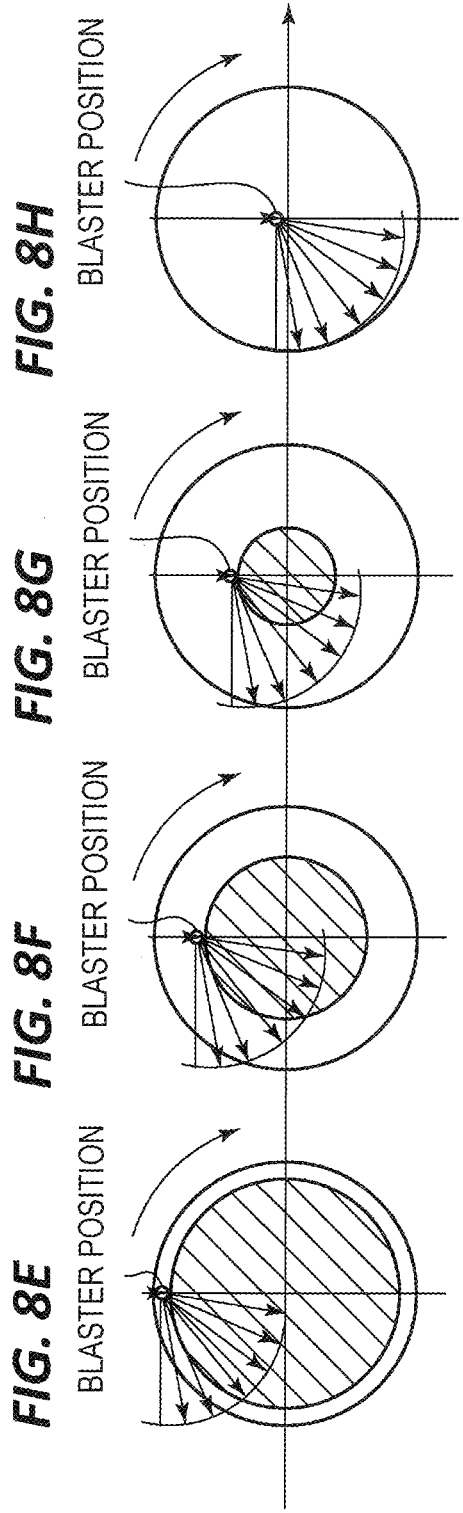

ONE EXHAUST PORT

TWO EXHAUST PORTS

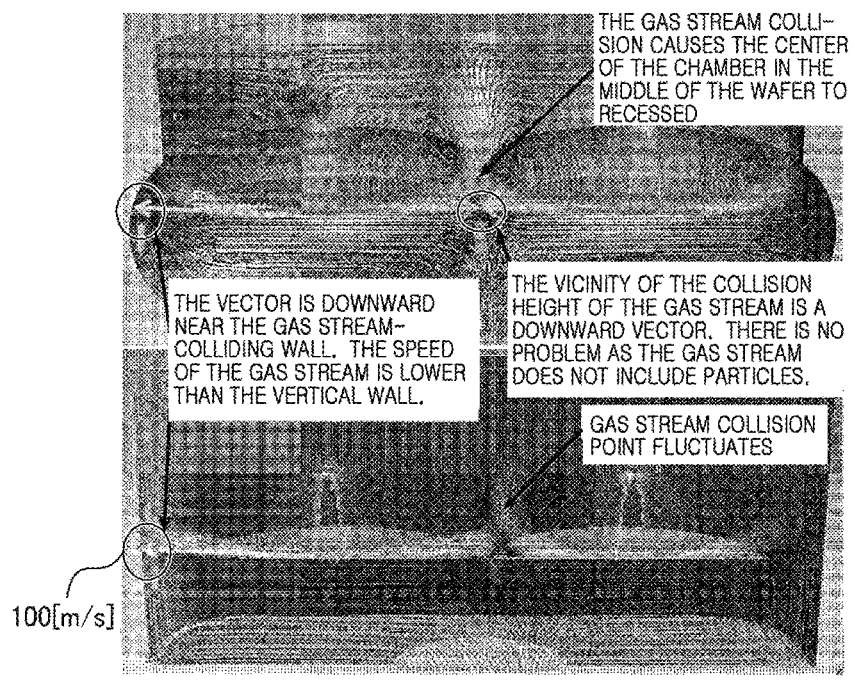

THE NOZZLE UNIT IS AT THE CENTER OF THE WAFER

THE NOZZLE UNIT IS AT THE PERIPHERAL EDGE OF THE WAER

FIG. 12A
NO UPWARD EXHAUST
FIG. 12B
UPWARD EXHAUST
1/10 OF TOTAL FLOW RATE
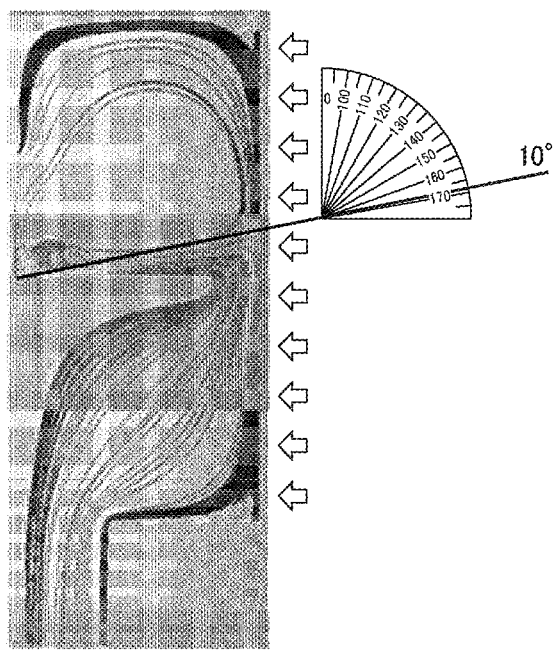
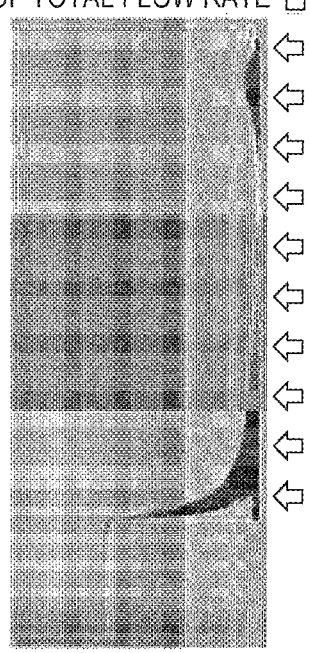

FIG. 13A
NO UPWARD EXHAUST
FIG. 13B
UPWARD EXHAUST
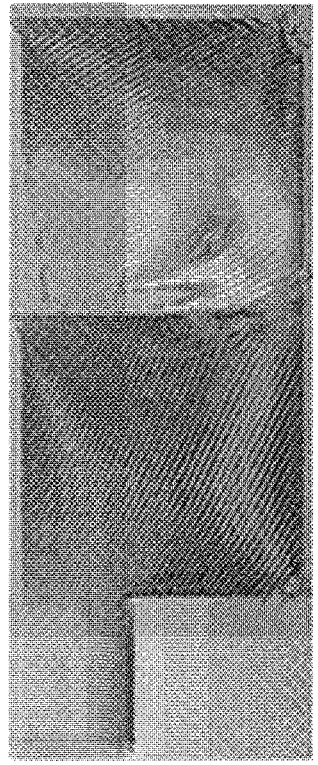
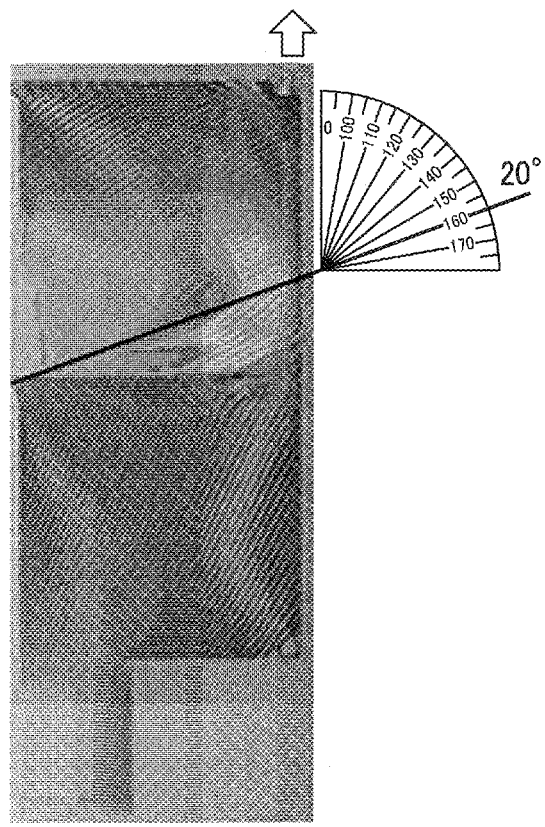

PARTICLES ARE CONFINED WITH STAGNATION OF THE GAS STREAM

SUBSTRATE CLEANING APPARATUS

CROSS REFERENCE TO RELATED APPLICATION

This application is a 35 U.S.C. 371 National Phase Entry Application from PCT/JP2016/081550, filed Oct. 25, 2016, which claims priority to Japanese Patent Application No. 2015-238283, filed Dec. 7, 2015, the disclosures of which are incorporated herein in their entirety by reference, and priority is claimed to each of the foregoing.

TECHNICAL FIELD

The present disclosure relates to a substrate cleaning apparatus that cleans a substrate by blasting gas clusters to the substrate.

BACKGROUND

In a semiconductor manufacturing process, adhesion of particles to a semiconductor substrate (semiconductor wafer) is one of the major factors that affect the yield of products. Therefore, a cleaning processing is performed on the substrate to remove the particles before or after a predetermined processing is performed on the substrate.

In the related art, two-fluid cleaning or aerosol cleaning using, for example, Ar or $N_2$ has been adopted as a technique for removing particles attached to a substrate in a semiconductor manufacturing process. However, such a technique is difficult to cope with recent miniaturization of semiconductor devices.

Therefore, a substrate cleaning apparatus using gas clusters has attracted attention as an apparatus capable of performing cleaning even on inside of a fine pattern (see, e.g., Patent Documents 1 to 3).

The gas clusters are formed by ejecting a high pressure gas into a vacuum and cooling the gas to a condensation temperature by adiabatic expansion, so that some of the atoms or molecules of the gas are aggregated by van der Waals force.

PRIOR ART DOCUMENT

Patent Document

Patent Document 1: Japanese Patent Laid-Open Publication No. 2013-026327
Patent Document 2: Japanese Patent Laid-Open Publication No. 2015-026745
Patent Document 3: Japanese Patent Laid-Open Publication No. 2015-041646

DISCLOSURE OF THE INVENTION

Problems to be Solved

However, in the substrate cleaning apparatus using the gas clusters, it has been found that particles removed from the substrate during the cleaning processing and particles once adhering to the chamber wall re-adhere to the substrate. The number of particles adhering to the substrate is required to be extremely small. Thus, it is desired to suppress the re-adhesion of the particles.

Therefore, an object of the present disclosure is to provide a substrate cleaning apparatus capable of suppressing re-adhesion of particles to a substrate when a substrate cleaning is performed using gas clusters.

Means to Solve the Problems

According to a first aspect, the present disclosure provides a substrate cleaning apparatus that cleans a processing target substrate by blasting gas clusters to the processing target substrate. The substrate cleaning apparatus includes: a chamber configured to accommodate the processing target substrate; a rotary stage configured to rotatably support the processing target substrate in the chamber; a blasting unit configured to blast the gas clusters to the processing target substrate supported by the rotary stage; a driving unit configured to scan a gas cluster-blasted position on the processing target substrate; an exhaust port configured to evacuate the chamber; and a control mechanism configured to control a scattering direction of particles by controlling a rotation direction of the processing target substrate by the rotary stage and a scanning direction of the gas cluster-blasted position, thereby suppressing re-adhesion of the particles to the processing target substrate.

According to a second aspect, the present disclosure provides substrate cleaning apparatus that cleans a processing target substrate by blasting gas clusters to the processing target substrate. The apparatus includes: a chamber configured to accommodate a plurality of processing target substrates; a plurality of rotary stages configured to rotatably support the plurality of processing target substrates, respectively, in the chamber; a plurality of blasting units configured to blast the gas clusters to the plurality of processing target substrates supported by the rotary stages, respectively; a driving unit configured to scan a gas cluster-blasted position on each of the processing target substrates; an exhaust port configured to evacuate the chamber; and a control mechanism configured to control a scattering direction of particles by controlling a rotation direction of the processing target substrate by each of the rotary stages and a scanning direction of the gas cluster-blasted position, thereby suppressing re-adhesion of the particles to the processing target substrate and interference of particles between the plurality of processing target substrates.

In the first and second aspects, the control mechanism may control the scattering direction of the particles such that the particles are guided to the exhaust port. Further, the driving unit may be set so as to enable the gas cluster-blasted position to draw a scan trajectory toward the exhaust port.

In the first and second aspects, a portion of an inner wall of the chamber where a gas stream including particles from the processing target substrate hits may have a curved shape. Further, the exhaust port may include a main exhaust port provided in a bottom portion of the chamber and configured to evacuate the chamber and an upper exhaust port configured to discharge upward a gas stream in a region of the chamber above the processing target substrate. Further, the substrate cleaning apparatus may further include a transfer port configured to load and unload the processing target substrate into and from the chamber. The transfer port may be provided such that its opening range is shifted from a height position of the processing target substrate on the rotary stage during a cleaning processing. Further, a distance between the blasting unit and a wall surface of the chamber may be maintained such that a collision speed of a gas stream from the blasting unit against the wall surface is 100 m/sec or less.

In the first and second aspects, the driving unit may include a pivot shaft portion configured to pivot the driving unit, a pivot arm to which the blasting unit is attached and which is pivoted by the pivot shaft portion, and a driving mechanism configured to rotate the pivot shaft portion.

According to a third aspect, the present disclosure provides substrate cleaning apparatus that cleans a processing target substrate by blasting gas clusters to the processing target substrate. The apparatus includes: a chamber configured to accommodate two processing target substrates; two rotary stages configured to rotatably support the two processing target substrates, respectively, in the chamber; two blasting units configured to blast the gas clusters to the two processing target substrates supported by the rotary stages, respectively; a driving unit configured to scan a gas cluster-blasted position on each of the processing target substrates; and a main exhaust port provided in a bottom portion of the chamber and configured to evacuate the chamber. The main exhaust port is solely provided between arrangement positions of the two processing target substrates.

According to a fourth aspect, the present disclosure provides substrate cleaning apparatus that cleans a processing target substrate by blasting gas clusters to the processing target substrate. The apparatus includes: a chamber configured to accommodate two processing target substrates; two rotary stages configured to rotatably support the two processing target substrates, respectively, in the chamber; two blasting units configured to blast the gas clusters to the two processing target substrates supported by the rotary stages, respectively; a driving unit configured to scan a gas cluster-blasted position on each of the processing target substrates; and an exhaust port configured to evacuate the chamber. The two rotary stages are set such that the two processing target substrates are arranged, oriented, or angled to suppress mutual interference of particles.

According to a fifth aspect, the present disclosure provides substrate cleaning apparatus that cleans a processing target substrate by blasting gas clusters to the processing target substrate. The apparatus includes: a chamber configured to accommodate the processing target substrate; a rotary stage configured to rotatably support the processing target substrate in the chamber; an blasting unit configured to blast the gas clusters to the processing target substrate supported by the rotary stage; a driving unit configured to scan a gas cluster-blasted position from the blasting unit, on the processing target substrate; and an exhaust port configured to evacuate the chamber. A portion of an inner wall of the chamber where a gas stream including particles from the processing target substrate hits has a curved shape.

According to a sixth aspect, the present disclosure provides substrate cleaning apparatus that cleans a processing target substrate by blasting gas clusters to the processing target substrate. The apparatus includes: a chamber configured to accommodate the processing target substrate; a rotary stage configured to rotatably support the processing target substrate in the chamber; an blasting unit configured to blast the gas clusters to the processing target substrate supported by the rotary stage; a driving unit configured to scan a gas cluster-blasted position from the blasting unit, on the processing target substrate; a main exhaust port provided in a bottom portion of the chamber and configured to evacuate the chamber; and an upper exhaust port configured to discharge upward a gas stream in a region of the chamber above the processing target substrate.

According to a seventh aspect, the present disclosure provides substrate cleaning apparatus that cleans a processing target substrate by blasting gas clusters to the processing target substrate. The apparatus includes: a chamber configured to accommodate the processing target substrate; a rotary stage configured to rotatably support the processing target substrate in the chamber; an blasting unit configured to blast the gas clusters to the processing target substrate supported by the rotary stage; a driving unit configured to scan a gas cluster-blasted position from the blasting unit, on the processing target substrate; an exhaust port configured to evacuate the chamber; and a transfer port configured to load and unload the processing target substrate into and from the chamber. The transfer port is provided such that its opening range is shifted from a height position of the processing target substrate on the rotary stage during a cleaning processing.

According to an eighth aspect, the present disclosure provides substrate cleaning apparatus that cleans a processing target substrate by blasting gas clusters to the processing target substrate. The apparatus includes: a chamber configured to accommodate the processing target substrate; a rotary stage configured to rotatably support the processing target substrate in the chamber; an blasting unit configured to blast the gas clusters to the processing target substrate supported by the rotary stage; a driving unit configured to scan a gas cluster-blasted position from the blasting unit, on the processing target substrate; and an exhaust port configured to evacuate the chamber. A distance between the blasting unit and a wall surface of the chamber is maintained such that a collision speed of a gas stream from the blasting unit against the wall surface is 100 m/sec or less.

According to a ninth aspect, the present disclosure provides substrate cleaning apparatus that cleans a processing target substrate by blasting gas clusters to the processing target substrate. The apparatus includes: a cyclone type chamber including a cylindrical upper portion, a conical lower portion, and an exhaust port in a bottom portion thereof, and configured to accommodate the processing target substrate; a stage configured to support the processing target substrate in the chamber; an blasting unit configured to blast gas clusters to the processing target substrate supported by the stage; and a rectifying member provided annularly along an outer periphery of the processing target substrate. The rectifying member includes a plurality of rectifying plates provided in a circumferential direction, an upper portion thereof is closed with an annular cover ring, and a gas stream above the processing target substrate is exhausted from the exhaust port through a space between the rectifying plates and an outer space between a wall portion of the chamber and the rectifying member.

In the first to ninth aspects, the substrate cleaning apparatus may further include a ring member disposed on an outer periphery of the processing target substrate. Further, the substrate cleaning apparatus may further include a baffle plate provided at a position lower than the processing target substrate on the inner wall of the chamber. Further, the substrate cleaning apparatus may further include a side-flow supply mechanism configured to supply a horizontal side-flow toward the exhaust port into the chamber. Further, the substrate cleaning apparatus may further include a down-flow supply mechanism configured to supply a down-flow into the chamber.

Effect of the Invention

According to the present disclosure, it is possible to provide a substrate cleaning apparatus capable of suppressing re-adhesion of particles to a substrate when a substrate cleaning is performed using gas clusters.

BRIEF DESCRIPTION OF THE DRAWINGS

FIGS. 7A to 7H are views for explaining a particle scattering direction when the wafer rotation direction is counterclockwise.

FIGS. 8A to 8H are views for explaining a particle scattering direction when the wafer rotation direction is clockwise.

FIGS. 9A and 8B are diagrams illustrating simulation results of a flow velocity distribution by fluid analysis software in a case where one exhaust port is provided between two wafers and in a case where exhaust ports are provided corresponding to two wafers, respectively.

FIGS. 10A and 10B are diagrams illustrating simulation results of a flow velocity by fluid analysis software in a case where the wall portion of the chamber has a curved shape and the portion corresponding to the wafer height of the wall portion of the chamber is an outwardly protruding R-shaped concave portion and in a case where the chamber has a vertical wall portion, respectively.

FIGS. 12A and 12B are diagrams illustrating simulation results of particle trajectories and flow velocity distributions by fluid analysis software when particles are generated from the inner wall of the chamber in a case of "no upward exhaust" and in a case of "upward exhaust," respectively.

FIGS. 13A and 13B are diagrams illustrating simulation results of a flow velocity distribution by fluid analysis software in a case of "no upward exhaust" and in a case of "upward exhaust," respectively.

DETAILED DESCRIPTION TO EXECUTE THE INVENTION

Hereinafter, exemplary embodiments of the present disclosure will be described with reference to the drawings.

First Exemplary Embodiment

Figure 1:
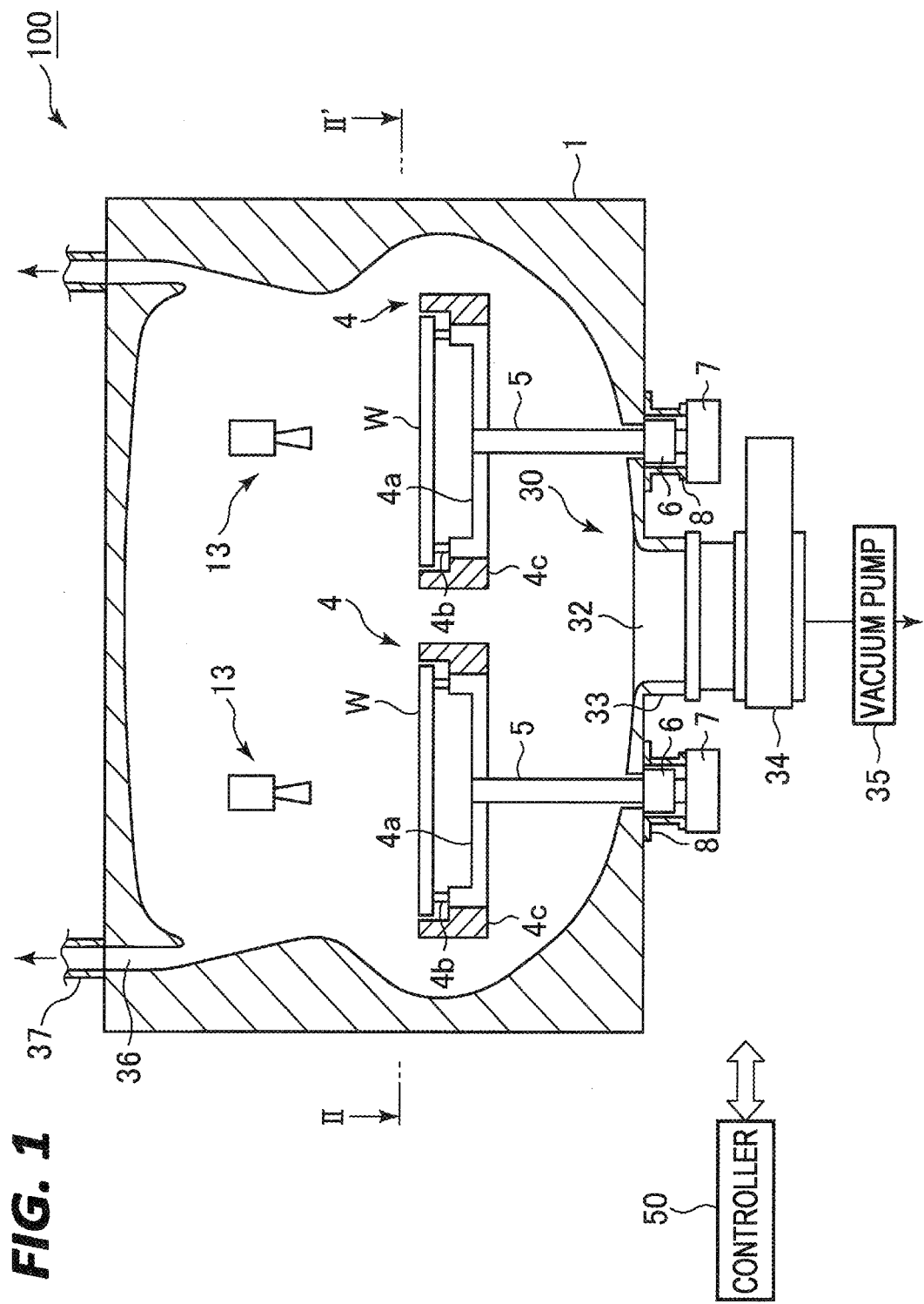
FIG. 1 is a vertical-sectional view illustrating an exemplary substrate cleaning apparatus according to a first exemplary embodiment of the present disclosure.
Figure 2:
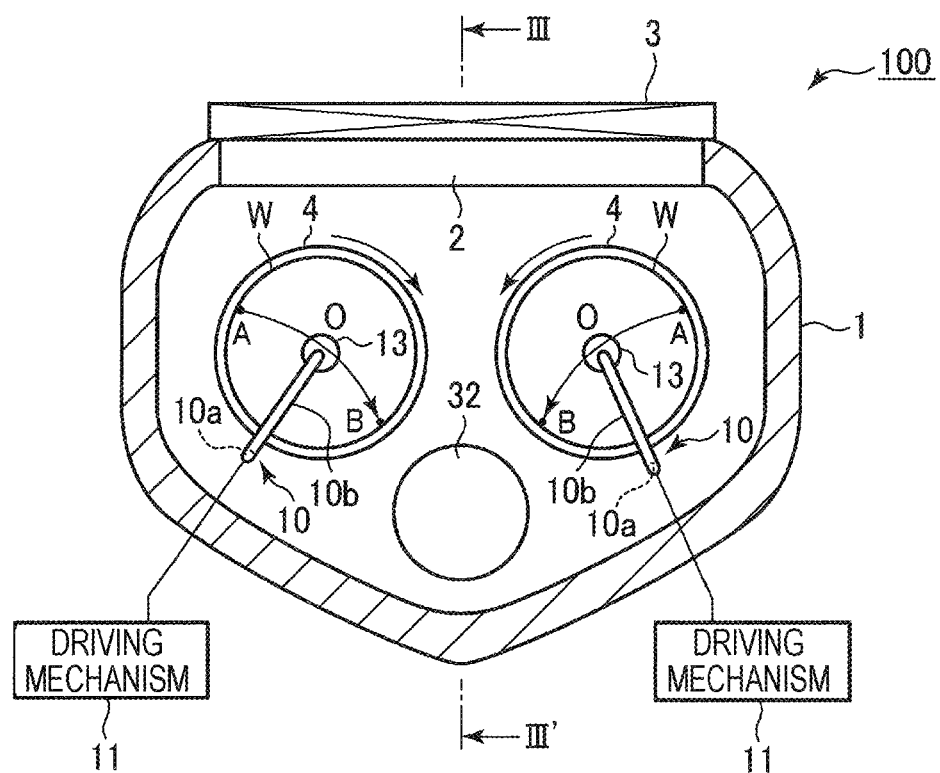
FIG. 2 is a horizontal-sectional view taken along line II-II' of the substrate cleaning apparatus of FIG. 1.
Figure 3:
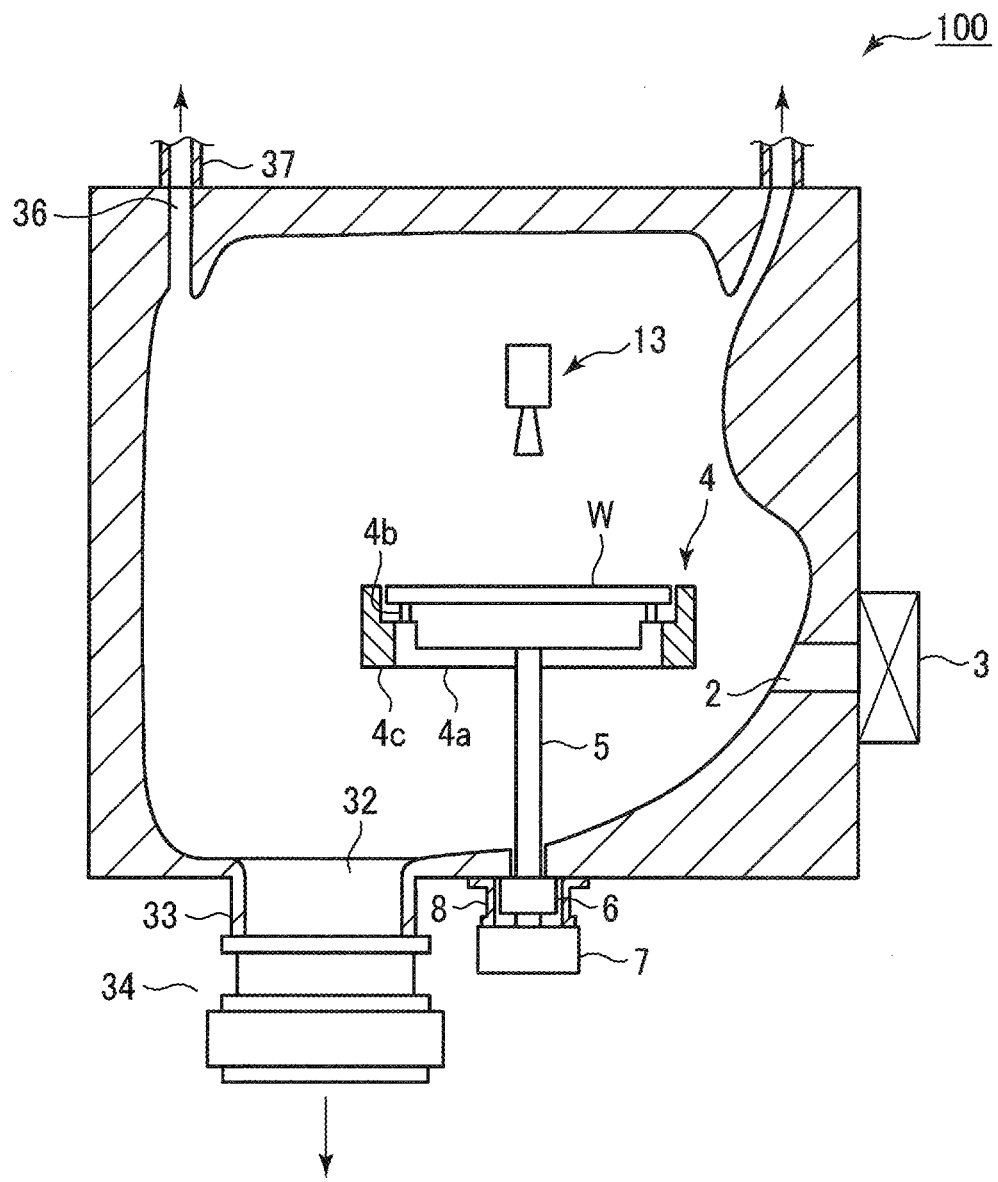
FIG. 3 is a vertical-sectional view taken along line III-III' of the substrate cleaning apparatus of FIG. 2.
Figure 4:
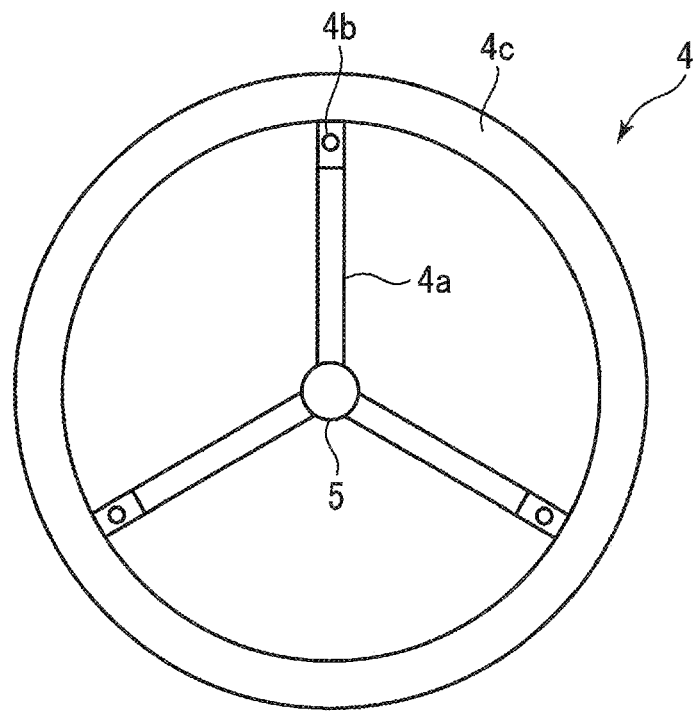
FIG. 4 is a plan view illustrating a rotary stage.

FIG. 1 is a vertical-sectional view illustrating an exemplary substrate cleaning apparatus according to a first exemplary embodiment of the present disclosure. FIG. 2 is a horizontal-sectional view taken along line II-II' of FIG. 1. FIG. 3 is a vertical-sectional view taken along line III-III' of FIG. 2. FIG. 4 is a plan view illustrating a rotary stage.

A substrate cleaning apparatus 100 is configured to perform a cleaning processing on a processing target substrate before or after a vacuum processing such as a film formation processing (e.g., CVD or sputtering) or etching. The substrate cleaning apparatus 100 that performs the cleaning processing is connected to a vacuum transfer chamber of a cluster tool type multi-chamber system together with a plurality of vacuum processing apparatuses that perform the vacuum processing.

The substrate cleaning apparatus 100 includes a chamber 1 that defines a processing chamber for performing a cleaning processing. At the bottom of the chamber 1, two rotary stages 4 are arranged in parallel in the longitudinal direction of the chamber 1 and each configured to place thereon a semiconductor wafer (hereinafter, simply referred to as a wafer) W as a processing target substrate in a horizontal posture. Each rotary stage 4 is connected with a motor 6 via a rotary shaft 5, and the motor 6 is configured to be moved up and down by an elevating mechanism 7. As a result, the rotary stages 4 are rotated and moved up and down. A space between the bottom portion of the chamber 1 and the elevating mechanism 7 is sealed with a sealing member 8. As illustrated in FIG. 4, each rotary stage 4 includes three arms 4a extending from the center, wafer support portions 4b disposed at the outer end portions of the arms, and a large-diameter ring 4c disposed outside the wafer W. The large-diameter ring 4c has the same height as the wafer W and has a width of about 5 mm to 10 mm on the outside of the wafer W. Further, during the cleaning processing, the rotary stage 4 supports the wafer W at a relatively high position from the bottom portion of the chamber 1, so that the wafer W is hardly influenced by particles wound from the bottom portion of the chamber 1.

In the bottom portion of the chamber 1, one main exhaust port 32 is provided at a position between the two rotary stages 4, and an exhaust pipe 33 is connected to the main exhaust port 32. The exhaust pipe 33 is provided with a pressure control valve 34 and a vacuum pump 35. The inside of the chamber 1 is evacuated by the vacuum pump 35, and the degree of opening of the pressure control valve 34 is controlled to control the degree of vacuum in the chamber 1. These constitute the exhaust mechanism 30, thereby maintaining the inside of the chamber 1 at a predetermined degree of vacuum and discharging the removed particles to the outside of the chamber 1. Therefore, when one main exhaust port 32 is provided at a position between the two rotary stages 4, it is possible to suppress winding-up of the gas stream above the wafer due to collision of the gas stream.

In the upper portion of the chamber 1, an exhaust port 36 is annularly provided along the outer periphery of the chamber 1, and an upper exhaust pipe 37 is connected to the upper exhaust port 36. A vacuum pump (not illustrated) is connected to the upper exhaust pipe 37 so as to perform exhaust in a small exhaust amount of about 1/10 of the total exhaust amount. The upper exhaust port 36 is an auxiliary exhaust port for smoothly discharging the particles in the chamber 1. The exhaust port 36 may be disposed in a portion corresponding to the outer periphery of the wafer. In the case of a two-sheet apparatus as in the present exemplary embodiment, the exhaust port 36 may be arranged so as to draw a figure "8" along the outer periphery of the two wafers. Further, a plurality of exhaust ports 36 may be provided along the outer periphery of the chamber 1 or along portions corresponding to the outer periphery of the wafers.

A transfer port 2 is provided on the lateral surface of the chamber 1 to load and unload the wafers W into and from the vacuum transfer chamber of the multi-chamber system, and a gate valve 3 is provided in the transfer port 2 to open and close the transfer port 2 (see FIG. 2). The transfer port 2 is provided such that its opening range is shifted from the height position of the wafer W on the rotary stage 4 during the cleaning processing. In the present exemplary embodiment, the transfer port 2 is provided at a position lower than the wafer W. Therefore, the particles are suppressed from being wound up in the chamber 1 when the particles removed in the transfer port 2 remain in the stagnation of the gas stream and the gate valve 3 is opened and closed.

A nozzle unit 13 is provided above each of the two rotary stages 4 to blast gas clusters to each wafer W. The nozzle unit 13 is configured to be moved on the wafer W placed on the rotary stage 4. As illustrated in FIG. 2, the nozzle unit 13 is pivoted by a nozzle unit moving member 10. The nozzle unit moving member 10 is provided on the deep side as viewed from the transfer port 2 of the chamber, and includes a pivot shaft portion 10a and a pivot arm 10b. The nozzle unit 13 is attached to the tip of the pivot arm 10b. Then, the pivot arm 10b is pivoted (rotated) about the pivot shaft portion 10a by a driving mechanism 11, and the nozzle unit 13 moves along a trajectory passing directly above the center of the wafer W on the wafer W by the pivot of the pivot arm 10b. That is, the nozzle unit 13 performs scanning on the rotating wafer W. In FIGS. 1 and 3, illustration of the nozzle unit moving member 10 and the driving mechanism 11 is omitted.

A cleaning gas (a gas for cluster generation) is supplied to the nozzle unit 13 via a pipe (not illustrated) provided inside the nozzle unit moving member 10.

The nozzle unit 13 ejects the cleaning gas from a region where the pressure is higher than the processing atmosphere in the chamber 1, toward the wafer W in the chamber 1 and cools the cleaning gas to the condensation temperature by adiabatic expansion, thereby generating gas clusters which are aggregates of atoms or molecules of the gas condensed by van der Waals force. The generated gas clusters are blasted substantially perpendicularly toward the wafer W.

In the present exemplary embodiment, a portion of the inner wall of the chamber 1 where a gas stream including particles from the wafer hits has a curved shape. Therefore, the collision speed of the gas stream including the particles is relaxed, so that generation of particles is suppressed. Specifically, since the portion corresponding to the wafer height of the inner wall of the chamber 1 is an outwardly protruding R-shaped concave portion, the gas stream colliding therewith is directed downward. Thus, particles are less likely to be generated.

The substrate cleaning apparatus 100 includes a control unit 50 that controls each component of the substrate cleaning apparatus 100. The control unit 50 has a controller including a microprocessor (computer) that controls, for example, the supply of the gas of the substrate cleaning apparatus 100, the evacuation of the gas, and the driving system of the rotary stage 4. The controller is connected with, for example, a keyboard through which an operator performs an input operation of a command to manage the substrate cleaning apparatus 100, and a display that visually displays the operation state of the substrate cleaning apparatus 100. Further, the controller is connected with a storage unit that stores, for example, a processing recipe which is a control program for implementing a processing in the substrate cleaning apparatus 100 under the control of the controller or a control program for causing each component of the substrate cleaning apparatus 100 to execute a predetermined processing in accordance with processing conditions, or various databases. Then, if necessary, an arbitrary recipe is called from the storage unit and executed by the controller, so that a desired processing is performed in the substrate cleaning apparatus 100 under the control of the controller.

In the present exemplary embodiment, the control unit 50 controls respective components so as to blast the gas clusters C to the wafer W while rotating the wafer W and causing the nozzle unit 13 to scan on the wafer W to eject the gas clusters thereto. At this time, the scattering direction of the particles may be controlled by controlling the rotation direction of the wafer W and the scanning direction of the nozzle portion 13. Therefore, it is possible to suppress particles from being scattered in the chamber 1.

Next, descriptions will be made on a cleaning operation in the substrate cleaning apparatus configured as described above.

First, the gate valve 3 is opened, and the wafer W as a processing target substrate is carried into the chamber 1 via the transfer port 2. Then, the wafer W is placed on the rotary stage 4 by moving up and down the rotary stage 4 such that the wafer W is positioned at a predetermined height position. Next, the nozzle unit 13 is positioned at the blasting start position. While rotating the wafer W by the rotary stage 4, the gas clusters are blasted from the nozzle unit 13, and the nozzle unit 13 scans by pivoting the pivot arm 10b, thereby scanning the gas cluster-blasted position on the wafer W. At this time, the rotation speed of the wafer W by the rotary stage 4 is set to be, for example, 20 rpm to 200 rpm. By moving the nozzle unit 13 while rotating the wafer W in this manner, the gas clusters are blasted on the entire surface of the wafer W. The gas cluster-blasted position may be continuously moved or intermittently moved. The blasting start position and the blasting end position of the gas clusters are set as described later.

Figure 5:
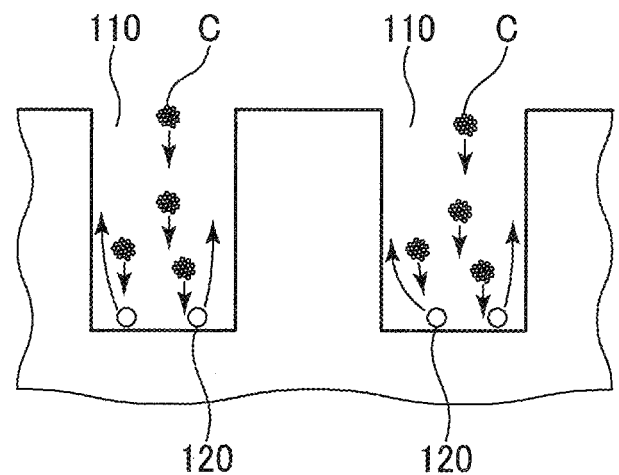
FIG. 5 is a sectional view schematically illustrating a state where gas clusters are blasted into recessed portions for a circuit pattern of a wafer.

As illustrated in FIG. 5, the gas clusters C blasted from the nozzle unit 13 are blasted substantially vertically toward the wafer W and enter recesses 110 for the circuit pattern of the wafer W. Then, the particles 120 in the recesses 110 are blown off and removed by the gas clusters C or constituent molecules of the gas clusters decomposed when the gas clusters collide with the wafer W.

The supply pressure of the cleaning gas supplied to the nozzle unit 13 may be raised by a pressure rising mechanism such as a booster. Further, a filter may be provided to remove impurities in the gas.

In this manner, the blasted position of the gas clusters C is scanned on the wafer W by pivoting the nozzle unit 13 while blasting the gas clusters C from the nozzle unit 13. However, the scattering direction of the particles removed from the wafer W at this time is determined by the rotation direction of the wafer W and the scanning direction of the gas cluster-blasted position. That is, the scattering direction of the particles on the wafer W may be controlled by the rotation direction of the wafer W and the scanning direction of the gas cluster-blasted position.

Figure 6:
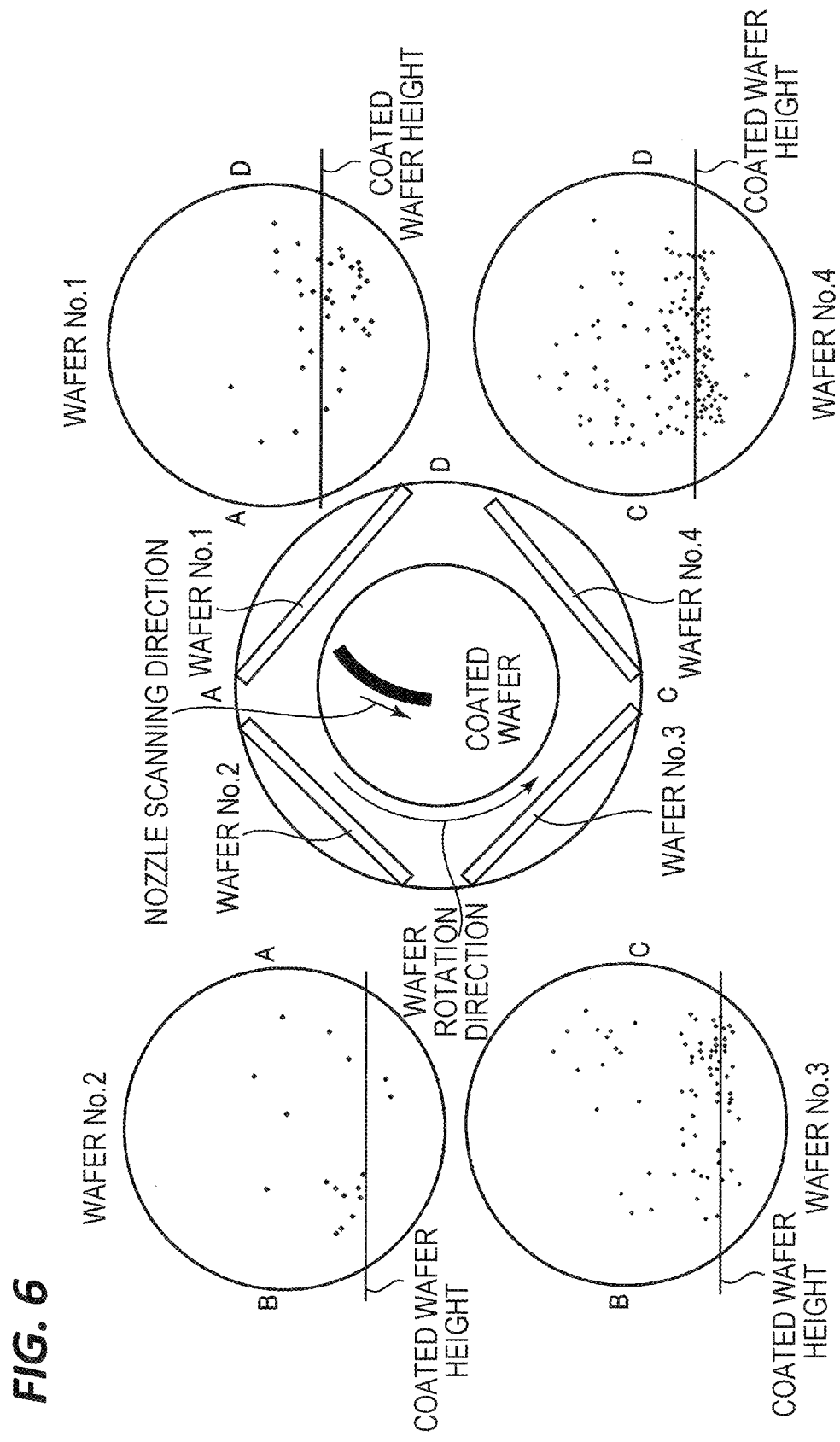
FIG. 6 is a view illustrating tests and results of confirming a scattering direction of particles in a case of rotating wafers to be cleaned and blasting gas clusters to the wafers while causing a nozzle unit to scan.

This will be described with reference to FIG. 6. FIG. 6 is a view for explaining the adhesion state of bare wafers when a cleaning test is performed using gas clusters, in which a coated wafer (200 mm) coated with silica ($SiO_2$) having particle sizes of 140 to 170 was set as a cleaning target on the rotary stage in the chamber, four bare wafers (300 mm) were vertically arranged around the cleaning target wafer in the chamber so as to reach the vicinity of the ceiling from the bottom portion of the chamber, and while the coated wafer was rotated in the counterclockwise direction, the nozzle unit was pivoted from the upper peripheral portion in the figure toward the center of the wafer. The situation of the test is illustrated in the center of FIG. 6, and the particle adhesion states of Nos. 1 to 4 of the bare wafers are illustrated therearound. The lines drawn in Nos. 1 to 4 are the height of the coated wafer. Further, among the bare wafers indicating the particle adhesion states, Nos. 3 and 4 actually indicates that the particle adhesion surface is transparent from the back side.

As illustrated in FIG. 6, for the adhesion amount of the particles, the number of particles was high in Nos. 3 and 4 on the side of the scanning direction of the nozzle unit, that is, on the side of the scanning direction side of the gas cluster-blasted position. Particularly, the number of particles was high in No. 4 on the downstream side of the wafer rotation direction. Meanwhile, the number of particles was low in Nos. 1 and 2 on the side opposite to the scanning direction of the gas cluster-blasted position. Particularly, the number of particles was low in No. 2 on the downstream side of the wafer rotation direction. From this, it is understood that the scattering direction of the particles removed from the wafer is determined by the rotation direction of the wafer and the scanning direction of the gas cluster-blasted position.

In addition, from this result, the particle scattering direction is expected to be as illustrated in FIGS. 7A to 7H when the rotation direction of the wafer W is counterclockwise, and to be as illustrated in FIGS. 8A to 8H when the rotating direction of the wafer W is clockwise. That is, in the case of rotating the wafer W counterclockwise and moving the gas cluster-blasted position from the center of the wafer to the outside, as illustrated in FIGS. 7A to 7D, the scattering direction of the particles is expected to be on the upper right side. In the case of rotating the wafer W counterclockwise and moving the gas cluster-blasted position from the outside of the wafer to the center, as illustrated in FIGS. 7E to 7H, the scattering direction of particles is expected to be on the lower right side. Meanwhile, in the case of rotating the wafer W clockwise and moving the gas cluster-blasted position from the center of the wafer to the outside, as illustrated in FIGS. 8A to 8D, the scattering direction of the particles is expected to be on the upper left side. In the case of rotating the wafer W clockwise and moving the gas cluster-blasted position from the outside of the wafer to the center, as illustrated in FIGS. 8E to 8H, the scattering direction of particles is expected to be on the lower left side. In addition, regardless of the scan direction of the gas cluster-blasted position, it is expected that the particles will be scattered to the right when the rotation direction of the wafer W is counterclockwise and the particles will be scattered to the left when the rotation direction of the wafer W is clockwise.

In this manner, the scattering direction of the particles on the wafer W is able to be controlled by the rotation direction of the wafer W and the scanning direction of the gas cluster-blasted position. Thus, in consideration of the device design, the rotation of the wafer W and the gas cluster-blasted position are controlled such that particles scattered in the chamber 1 are discharged without adhering to the wafer W. Further, since the scan trajectory on the wafer W at the gas cluster-blasted position also affects the adhesion of particles to the wafer W, it is also important to set the position of the pivot shaft portion of the nozzle unit 13.

In the present exemplary embodiment, in consideration of this, as illustrated in FIG. 2, the wafer W on the left side is controlled to be rotated in the clockwise direction, and the wafer W on the right side is controlled to be rotated in the counterclockwise direction. In addition, the pivot direction of the nozzle unit 13, that is, the scanning direction of the gas cluster-blasted position is controlled in the direction from the upper left to the lower right in the wafer on the left side and in the direction from the upper right to the lower left in the wafer on the right side, that is, in the direction toward the exhaust port 32. Then, the position of the pivot shaft portion 10a is set so as to enable the gas cluster-blasted position to draw a scan trajectory toward the exhaust port 32.

As a result, it is possible to scatter the particles scattered from the wafer W in a direction of smoothly flowing to the exhaust port 32. In addition, it is possible to scatter particles in a direction where particles from one wafer are less likely to affect the other wafer.

In the cleaning processing, the nozzle unit 13 may be moved from a wafer peripheral portion A on the outside of FIG. 2 to a wafer central portion O, may be moved from the wafer central portion O to a wafer peripheral portion B on the inside, or may be moved from the peripheral portion A to the peripheral portion B. At this time, when the movement speed of the nozzle unit 13 is increased, one scanning time of the nozzle unit 13 becomes short, and when the movement speed of the nozzle unit 13 is decreased, one scanning time of the nozzle unit 13 becomes long. In addition, when the scan time is short, the blast energy of the total gas clusters to the wafer W is small, and when the scan time is long, the blast energy of the total gas clusters to the wafer W is large. Therefore, the movement speed of the nozzle unit 13 is appropriately set depending on the adhesion force of the particles to be removed. Further, the rotation speed of the wafer is appropriately set so as to obtain appropriate blast energy.

Figures 9A, 9B:
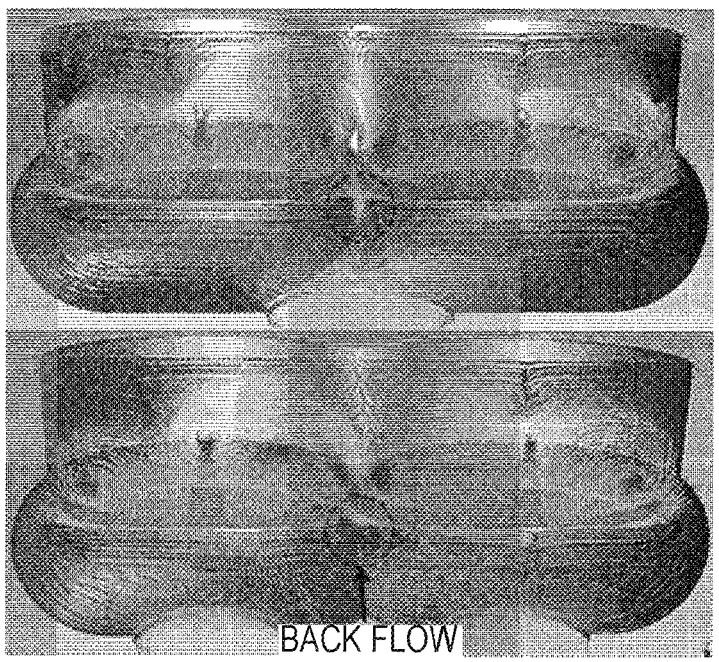

Further, in the present exemplary embodiment, one main exhaust port 32 is provided at a position between the two rotary stages 4. Thus, the gas stream from both wafers W smoothly flows to the main exhaust port 32, and the particles are suppressed from being wound up above the wafers W due to the collision of the gas stream. In the case of two-sheet processing, it is expected that the gas stream will flow more smoothly when the exhaust port is provided for each wafer, but according to the simulation result of the flow velocity distribution by the fluid analysis software in FIGS. 9A and 9B, a better result was obtained when one exhaust port 32 was used. That is, FIG. 9A illustrates a case where one exhaust port is provided between two wafers, but there is no winding-up due to collision of the gas stream, and the gas stream flows smoothly toward the exhaust port. Meanwhile, FIG. 9B illustrates a case where two exhaust ports are provided corresponding to two wafers, respectively. However, a gas stream collides at a portion between the two wafers, which causes a portion where the gas stream flows upwardly. From this, it is understood that forming one exhaust port at a portion between the two wafers is advantageous for suppressing the winding-up of the gas stream including particles.

Further, in the present exemplary embodiment, since the portion of the inner wall of the chamber 1 where the gas stream including the particles hits has a curved shape, it is possible to reduce the collision speed when a gas stream including particles collides, compared with the case of a vertical wall. Therefore, it is possible to suppress particles from being scattered. Specifically, the portion corresponding to the wafer height of the inner wall of the chamber 1 is an outwardly protruding R-shaped concave portion. As a result, the gas stream colliding therewith is directed downward, and even though particles are generated, the particles may be easily discharged from the exhaust port. This will be described based on the simulation result of the flow velocity distribution by the fluid analysis software of FIGS. 10A and 10B. FIG. 10A illustrates a result of the curved wall portion of the present exemplary embodiment, and FIG. 10B illustrates a result of the vertical wall. These are results when gas stream collides in the middle of two wafers. In FIG. 10A, the center of the chamber is recessed. As illustrated in the figures, the speed at the portion of the wall where the gas stream collides is smaller in the curved shape of FIG. 10A than the vertical wall of FIG. 10B. Further, the vector of the gas stream after the collision is upward and downward in the vertical wall of FIG. 10B, whereas the vector is downward in the curved wall of FIG. 10A because of the R shape. Further, in the case of FIG. 10A, the vicinity of the collision height of the gas stream including particles between the two wafers is a downward vector, so that the scattering of the particles is suppressed. Meanwhile, in the case of FIG. 10B, the gas stream collision point fluctuates, so that the particles may be scattered. Even in the case of FIG. 10A, the gas stream is somewhat wound up in the middle of the two wafers, but there is no problem as the gas stream does not include particles.

Figures 11A, 11B:
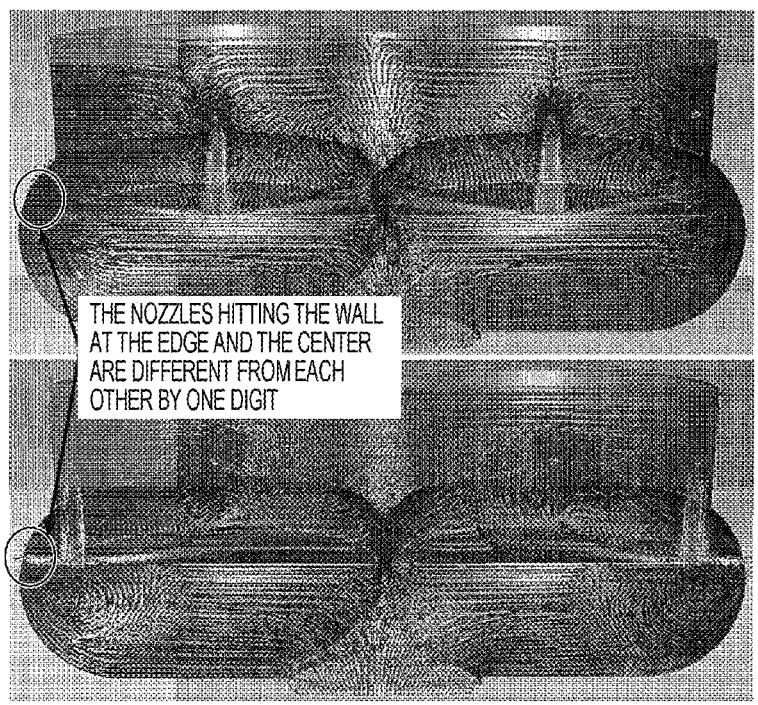
FIGS. 11A and 11B are diagrams illustrating simulation results of a flow velocity distribution by fluid analysis software in a case where the nozzle unit is located at the center of the wafer and in a case where the nozzle unit is located at a peripheral portion of the wafer close to the wall surface, respectively.

Furthermore, when the gas stream injected from the nozzle unit 13 is reflected by the wafer W and collides with the wall surface of the chamber 1 at a high speed, the risk of particle generation increases. From the viewpoint of suppressing the particle generation, the speed of the gas stream colliding with the wall surface may be 100 m/sec or less. Further, as the nozzle unit 13 is closer to the wall surface of the chamber 1, the collision speed of the gas stream to the wall surface increases. FIGS. 11A and 11B are diagrams illustrating simulation results of the flow velocity distribution by the fluid analysis software. FIG. 11A illustrates a case where the nozzle unit is located at the center of the wafer, and FIG. 11B illustrates a case where the nozzle unit is located at the peripheral edge portion of the wafer close to the wall surface. As illustrated in the figures, the speed of the gas stream hitting the wall surface is higher by one digit in the case where the nozzle unit is located at the peripheral edge portion closer to the wall surface than the case where the nozzle unit is located at the central portion. Therefore, even when the nozzle unit 13 comes closest to the chamber wall surface, the distance between the nozzle unit 13 and the wall surface of the chamber 1 may be kept at such a distance that the collision speed of the gas stream is 100 m/sec or less.

Furthermore, in addition to the main exhaust port 32, an upper exhaust port 36 is provided in the chamber 1 to evacuate about ⅒ of the total exhaust flow rate. Thus, the gas stream may be discharged without staying in the region above the wafer W in the chamber 1. Therefore, even when particles are generated from the inner wall surface of the chamber 1, the particles may be smoothly discharged from the upper and lower exhaust ports together with the gas stream, and re-adhesion of the particles to the wall surface of the chamber or the wafer may be suppressed. FIGS. 12A and 12B are diagrams illustrating simulation results of particle trajectories and flow velocity distributions by fluid analysis software when particles are generated from the inner wall of the chamber. FIG. 12A illustrates a case of "no upward exhaust," and FIG. 12B illustrates a case of "upward exhaust." In the case of "no upward exhaust," particles are scattered in the chamber as illustrated in FIG. 12A, whereas in the case of "upward exhaust" as illustrated in FIG. 12B, the gas stream including particles is smoothly discharged upward and downward, so that particles are hardly scattered in the chamber.

In this case, as described above, since the exhaust amount of the upward exhaust is as small as about ⅒ of the total exhaust amount, the upward exhaust hardly affects the overall flow velocity distribution in the chamber 1. FIGS. 13A and 13B are diagrams illustrating simulation results of the flow velocity distribution by the fluid analysis software. FIG. 13A illustrates a case of "no upward exhaust," and FIG.

13B illustrates a case of "upward exhaust," but it can be seen that the flow velocity distribution does not change depending on the presence or absence of the upward exhaust.

Figure 14:
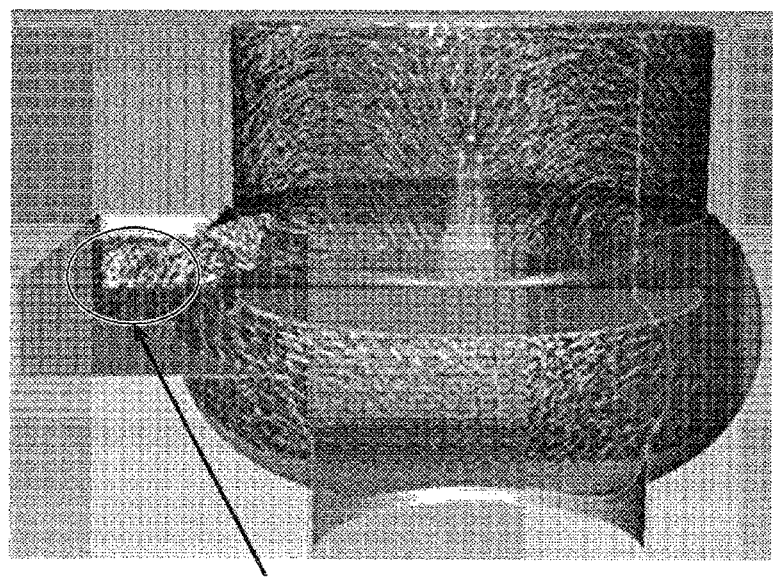
FIG. 14 is a diagram illustrating a simulation result of a flow velocity distribution by fluid analysis software in a case where the height position of the wafer is in the opening range of the transfer port.

Furthermore, in the present exemplary embodiment, the transfer port 2 is provided such that its opening range is shifted from the height position of the wafer W on the rotary stage 4 during the cleaning processing (in the present exemplary embodiment, at a position lower than the wafer W). Therefore, when the particles removed from the wafer W are confined in the stagnation of the gas stream in the transfer port 2 and the gate valve is opened and closed, the particles are suppressed from being wound up in the chamber 1. In a case where the height position of the wafer W on the rotary stage 4 is in the opening range of the transfer port 2, as illustrated in the simulation result of the flow velocity distribution by the fluid analysis software in FIG. 14, the gas stream including the particles reflected by the wafer enters the transfer port, and the particles are confined together with stagnation of the gas stream in the transfer port. Then, when the gate valve 3 is opened and closed, the confined particles may be wound up and adhere to the wafer W.

Furthermore, in the present exemplary embodiment, as illustrated in FIG. 4, the rotary stage 4 on which the wafer W is placed has the large-diameter ring 4c having the same height as the wafer W and a width of about 5 mm to 10 mm on the outside of the wafer W. Thus, it is possible to suppress disturbance of the gas stream when blasting the gas clusters to the wafer edge. In the case where the large-diameter ring 4c is not present, when the gas cluster hits the wafer edge, the behavior of the gas stream becomes complicated, and dust generation or particle winding-up occur from the bottom portion of the chamber 1 or the side wall of the chamber. However, when the large-diameter ring 4c having a width of about 5 mm to 10 mm on the outside of the wafer W is provided at the same height as the wafer W, complicated gas stream behavior does not occur even though the gas clusters are blasted to the wafer edge.

Further, since the rotary stage 4 supports the wafer W at a relatively high position from the bottom portion of the chamber 1 during the cleaning processing, the wafer W is hardly influenced by particles wound up from the bottom portion of the chamber 1.

Second Exemplary Embodiment

Figure 15:
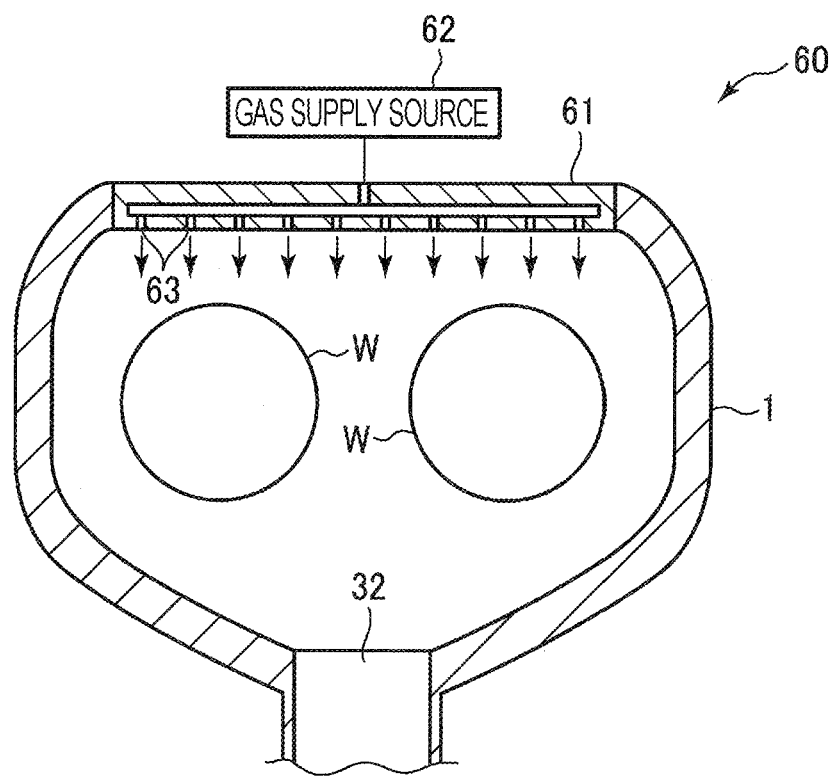
FIG. 15 is a horizontal-sectional view illustrating an exemplary substrate cleaning apparatus according to a second exemplary embodiment of the present disclosure.

FIG. 15 is a horizontal-sectional view illustrating an exemplary substrate cleaning apparatus according to a second exemplary embodiment of the present disclosure. In the present exemplary embodiment, the main exhaust port 32 of the substrate cleaning apparatus of the first exemplary embodiment is provided on a side wall, and a side-flow supply mechanism 60 is added to the chamber 1 to supply a side-flow in the horizontal direction toward the exhaust port.

The side-flow supply mechanism 60 includes a side-flow supply member 61 provided on a side wall of the chamber 1 opposite to the main exhaust port 32 and above the wafer W and a gas supply source 62 that supplies, for example, $N_2$ gas to the side-flow supply member 61. During the substrate cleaning with the gas clusters, the side-flow supply mechanism 60 ejects the gas from a plurality of gas ejection ports 63 provided in the side-flow supply member 61 to forms a side-flow toward the main exhaust port 32. With the side-flow, the particles that have risen and fallen in the chamber 1 may be exhausted before adhering to the wafer W.

Third Exemplary Embodiment

Figure 16:
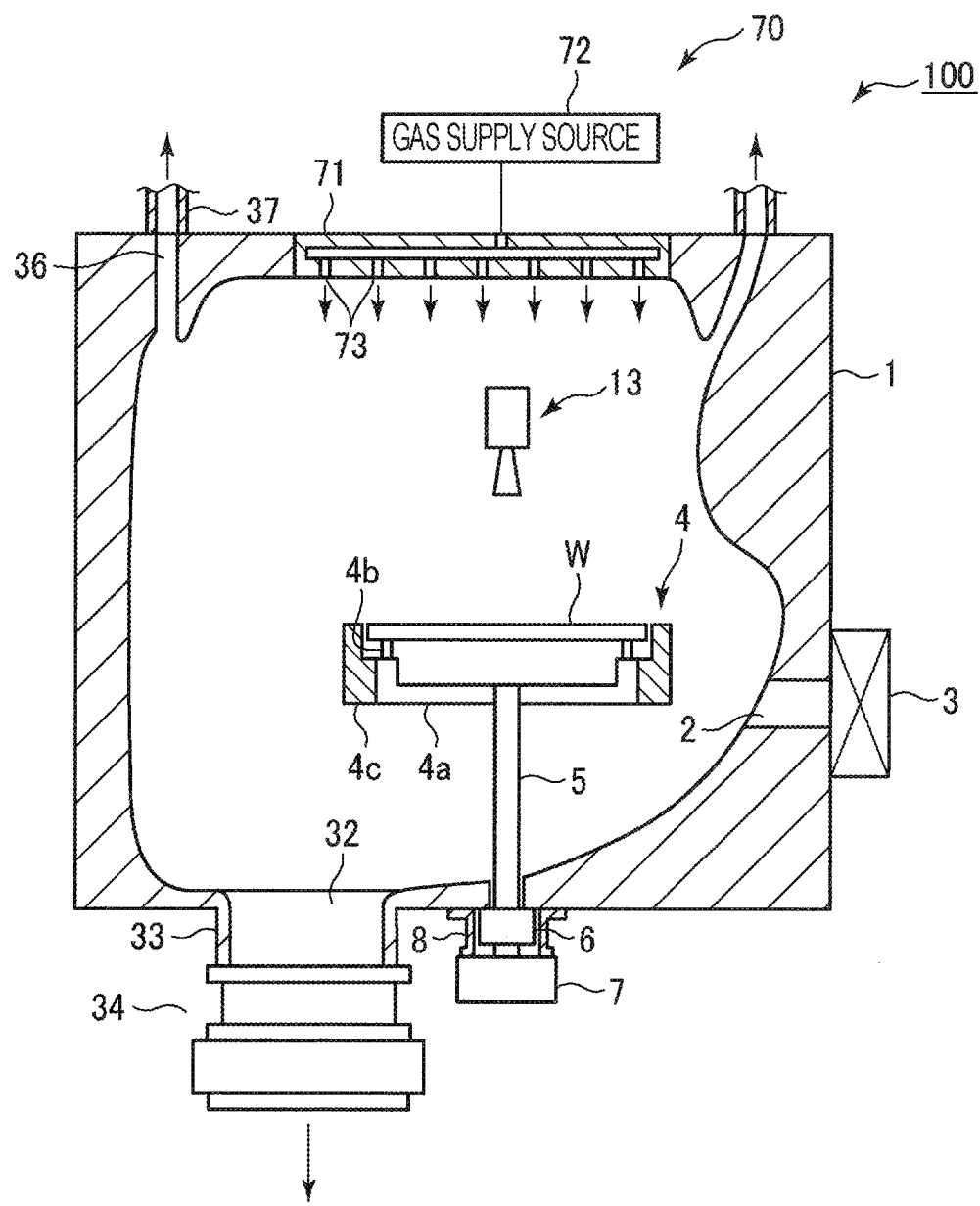
FIG. 16 is a vertical-sectional view illustrating an exemplary substrate cleaning apparatus according to a third exemplary embodiment of the present disclosure.

FIG. 16 is a vertical-sectional view illustrating an exemplary substrate cleaning apparatus according to a third exemplary embodiment of the present disclosure. In the present exemplary embodiment, a down-flow supply mechanism 70 is added to the substrate cleaning apparatus of the first embodiment to supply a down-flow into the chamber 1. In FIG. 16, illustration of the nozzle unit moving member 10 and the driving mechanism 11 is omitted.

The down-flow supply mechanism 70 includes a down-flow supply member 71 provided on the ceiling wall of the chamber 1 and a gas supply source 72 that supplies, for example, $N_2$ gas to the down-flow supply member 71. During the substrate cleaning with the gas clusters, the down-flow supply mechanism 60 ejects the gas from a plurality of gas ejection ports 73 provided in the down-flow supply member 71 to form a down-flow. As a result, it is possible to suppress the particles removed from the wafer W from being wound up to the upper side of the wafer W. Thus, it is possible to suppress the re-adhesion of the particles.

Fourth Exemplary Embodiment

Figure 17:
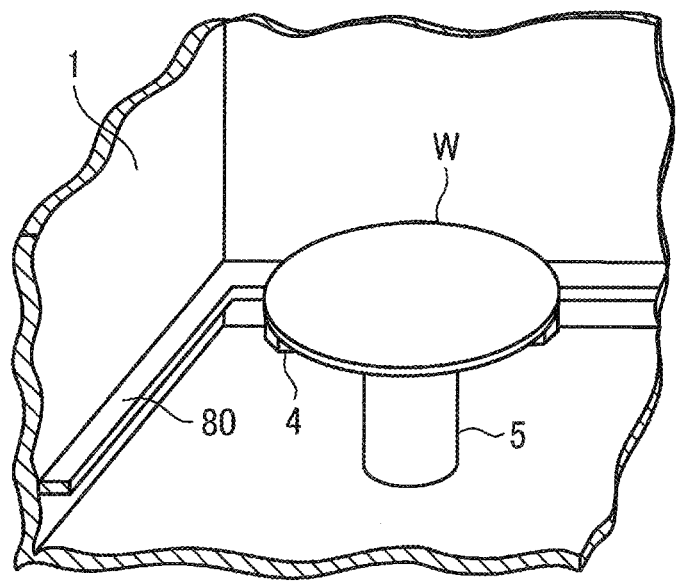
FIG. 17 is a perspective view illustrating an exemplary substrate cleaning apparatus according to a fourth exemplary embodiment of the present disclosure.

FIG. 17 is a perspective view illustrating an exemplary substrate cleaning apparatus according to a fourth exemplary embodiment of the present disclosure. In the present exemplary embodiment, unlike the first exemplary embodiment of the present disclosure, the wafer rotary stage 4 is not provided with the large-diameter ring 4c. Instead, a baffle plate 80 is provided at a position lower than the wafer placement position of the side wall (inner wall) of the chamber 1.

Figure 18:
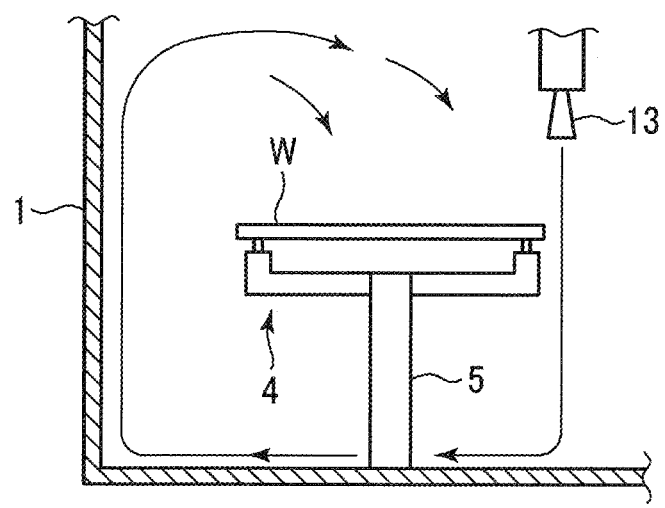
FIG. 18 is a view illustrating behavior of a gas stream including particles due to blasting of gas clusters from the nozzle unit to the bottom portion of the chamber in a case where a baffle plate is not provided on the wall portion of the chamber.
Figure 19:
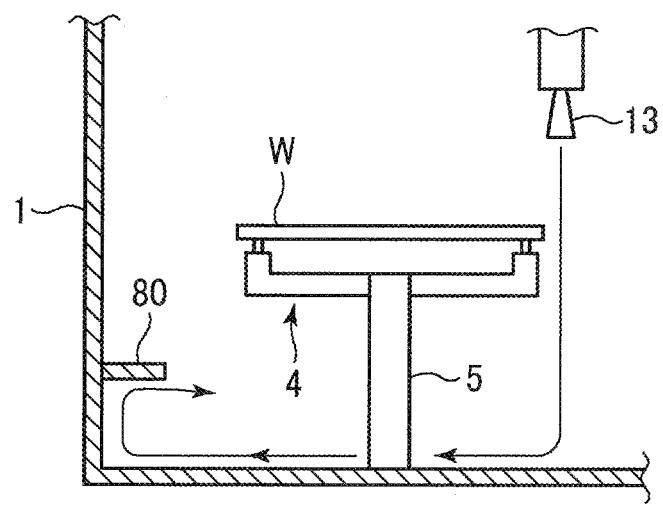
FIG. 19 is a view illustrating behavior of a gas stream including particles due to blasting of gas clusters from the nozzle unit to the bottom portion of the chamber in a case where a baffle plate is provided on the wall portion of the chamber.

In a case where no baffle plate is provided, as illustrated in FIG. 18, when the gas clusters ejected from the nozzle unit 13 are released from the wafer, a fast jet flow sweeps the particles on the bottom portion of the chamber 1, so that the gas stream including the particles rises up on the side wall of the chamber 1, and the particles adhere to the wafer W. Meanwhile, in the case where the baffle plate 80 is provided, as illustrated in FIG. 19, the gas stream including the particles rising up on the side wall of the chamber 1 is bent laterally by the baffle plate 80. Thus, the particles may be suppressed from being wound up to the wafer W.

Fifth Exemplary Embodiment

Figure 20:
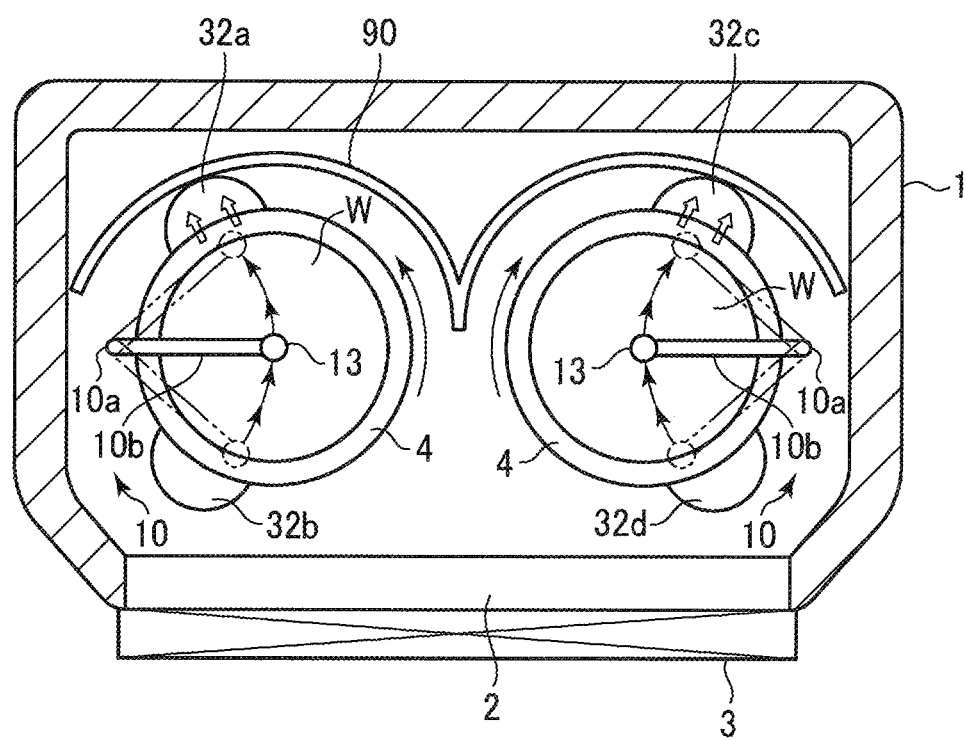
FIG. 20 is a horizontal-sectional view illustrating an exemplary substrate cleaning apparatus according to a fifth exemplary embodiment of the present disclosure.

FIG. 20 is a horizontal-sectional view illustrating an exemplary substrate cleaning apparatus according to a fifth exemplary embodiment of the present disclosure. The present exemplary embodiment is basically the same as the first exemplary embodiment, except that the number and position of the exhaust ports and the pivot position of the nozzle unit 13 on the wafer W are different from those in the first exemplary embodiment, and a shield member is provided. Hereinafter, descriptions will be made mainly on differences from the first exemplary embodiment.

As illustrated in FIG. 20, in the present exemplary embodiment, a wafer W is placed on each of two rotary stages 4 in the chamber 1. The rotary stages 4 are configured in the same manner as in the first exemplary embodiment.

Four main exhaust ports 32a, 32b, 32c, and 32d are provided in the bottom portion of the chamber 1. The main exhaust ports 32a, 32b, 32c, and 32d are provided near the four corners of the chamber 1 and at positions partially overlapping the wafer W. Further, the two wafers W are juxtaposed along the long side of the chamber 1, and the transfer port 2 is provided on one long side of the chamber 1 to load and unload the wafers W. Further, a shield member 90 is provided on the deep side of the transfer port 2 such that particles generated from the two wafers W do not interfere with each other. Among the four main exhaust ports, the main exhaust ports 32a and 32c are provided in the inner portion of the shield member 90.

Pivot shaft portions 10a of the nozzle units 13 of both wafers W are provided on a straight line passing through the centers of both wafers W and at end portions of the chamber 1. Each of the nozzle units 13 is configured to be pivoted on the wafer W via a pivot arm portion 10b by the pivot shaft portion 10a.

During the cleaning processing, the blasted position of the gas clusters C is scanned on the wafer W by pivoting the nozzle unit 13 while blasting the gas clusters C from the nozzle unit 13. However, even in the present exemplary embodiment, the scattering direction of the particles removed from the wafer W is determined by the rotation direction of the wafer W and the scanning direction of the gas cluster-blasted position. That is, the scattering direction of the particles removed from the wafer W may be controlled by the rotation direction of the wafer W and the scanning direction of the gas cluster-blasted position.

In the present exemplary embodiment, the wafer W on the left side is controlled to be rotated counterclockwise, the wafer W on the right side is controlled to be rotated clockwise, and the nozzle unit 13, which corresponds to the gas cluster-blasted position, is moved in the direction of the arrow in FIG. 20 and controlled such that the end point becomes the end portion of the wafer W on the shield member 90 side.

As a result, the removed particles scattered by the gas clusters from the nozzle unit 13 are guided to the main exhaust ports 32a and 32c on the shield member 90 side and discharged. As described above, when the scanning direction of the gas cluster-blasted position and the rotation direction of the wafers are controlled, the removed particles themselves and the particles entrained in the gas stream are suppressed from re-adhering to the wafers themselves. Further, since the scanning direction of the gas cluster-blasted position and its trajectory are optimized, the removed particles themselves that are scattered by the gas clusters are suppressed from interfering with each other between the two wafers. In addition, since the end point position of the gas cluster-blasted position is optimized and the shield member 90 is provided, the particles scattered with the jet flow are also suppressed from interfering with each other between the two wafers.

Sixth Exemplary Embodiment

Figure 21:
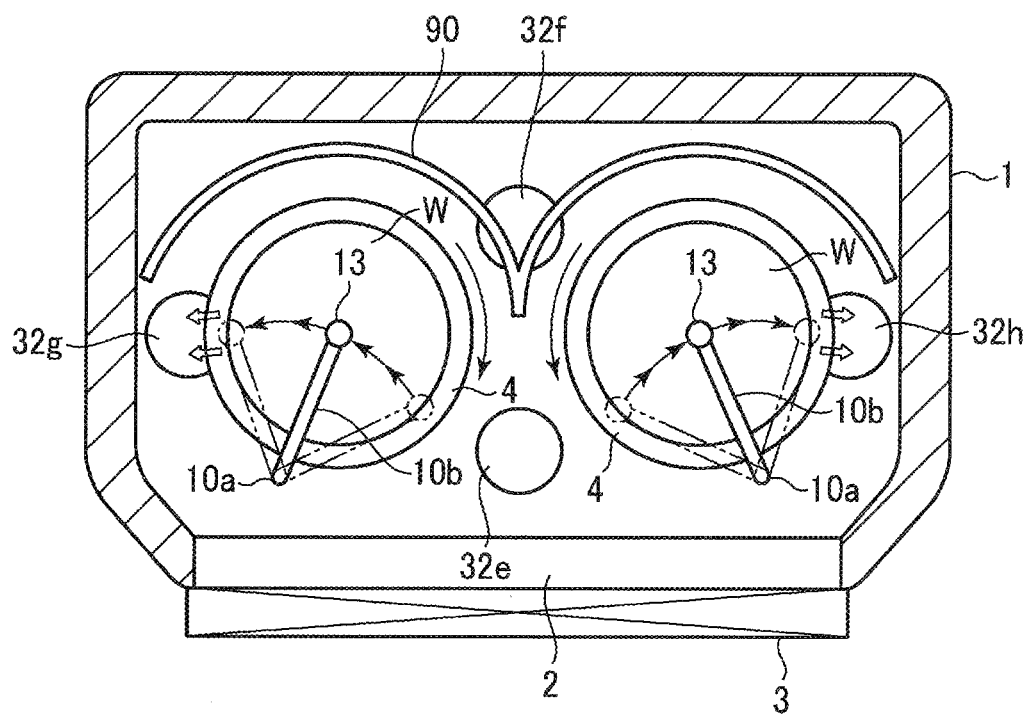
FIG. 21 is a horizontal-sectional view illustrating an exemplary substrate cleaning apparatus according to a sixth exemplary embodiment of the present disclosure.

FIG. 21 is a horizontal-sectional view illustrating an exemplary substrate cleaning apparatus according to a sixth exemplary embodiment of the present disclosure. The present exemplary embodiment is basically the same as the fifth exemplary embodiment, except that the arrangement of the exhaust port and the pivot position of the nozzle unit 13 on the wafer W are different from those in the fifth exemplary embodiment. Hereinafter, descriptions will be made mainly on differences from the fifth exemplary embodiment.

As illustrated in FIG. 21, in the present exemplary embodiment, a wafer W is placed on each of two rotary stages 4 in the chamber 1. The rotary stages 4 are configured in the same manner as in the first exemplary embodiment.

Four main exhaust ports 32e, 32f, 32g, and 32h are provided in the bottom portion of the chamber 1. Among the four main exhaust ports 32e, 32f, 32g, and 32h, the main exhaust ports 32e and 32f are provided on the transfer port 2 side and the shield member 90 side, respectively, between the two wafers W, and the main exhaust ports 32g and 32h are provided on a straight line passing through the centers of both wafers W and at the end portions of the chamber 1. Further, similarly to the fifth exemplary embodiment, the two wafers W are juxtaposed along the long side of the chamber 1, the transfer port 2 is provided on one long side of the chamber 1 to load and unload the wafers W, and the shield member 90 is provided on the deep side of the transfer port 2.

Pivot shaft portions 10a of the nozzle units 13 of both wafers W are provided on the transfer port 2 side. Each of the nozzle units 13 is configured to be pivoted on the wafer W via a pivot arm portion 10b by the pivot shaft portion 10a.

During the cleaning processing, the blasted position of the gas clusters C is scanned on the wafer W by pivoting the nozzle unit 13 while blasting the gas clusters C from the nozzle unit 13. However, even in the present exemplary embodiment, the scattering direction of the particles removed from the wafer W is determined by the rotation direction of the wafer W and the scanning direction of the gas cluster-blasted position. That is, the scattering direction of the particles removed from the wafer W may be controlled by the rotation direction of the wafer W and the scanning direction of the gas cluster-blasted position.

In the present exemplary embodiment, the wafer W on the left side is controlled to be rotated clockwise, the wafer W on the right side is controlled to be rotated counterclockwise, and the nozzle unit 13, which corresponds to the gas cluster-blasted position, is moved in the direction of the arrow in FIG. 21 and controlled such that the end point becomes the end portion of the wafer W on the short side of the wall of the chamber 1.

As a result, the removed particles scattered by the gas clusters from the nozzle unit 13 are guided to the main exhaust ports 32g and 32h on the end portion side of the chamber 1 and discharged. As described above, when the scanning direction of the gas cluster-blasted position and the rotation direction of the wafers are controlled, the removed particles themselves and the particles entrained in the gas stream are suppressed from re-adhering to the wafers themselves. Further, since the scanning direction of the gas cluster-blasted position and its trajectory are optimized, the removed particles themselves that are scattered by the gas clusters are suppressed from interfering with each other between the two wafers. In addition, since the end point position of the gas cluster-blasted position is optimized and the shield member 90 is provided, the particles scattered with the jet flow is also suppressed from interfering with each other between the two wafers. In consideration of the fact that the end point of the nozzle unit 13 is at the farthest position on the two wafers, and in consideration of the arrangement of the driving unit, the present exemplary embodiment may be said to be preferable to the fifth exemplary embodiment in suppressing interference of particles between the wafers.

Seventh Exemplary Embodiment

In the first to sixth exemplary embodiments, descriptions have been made on the case where two wafers are juxtaposed along the long side of the chamber 1. However, in order to suppress the mutual interference of the particles from the adjacent wafers, it is also important to devise, for example, arrangements, orientations, and angles of the wafers W in the chamber 1. In the present exemplary embodiment, some examples of desirable wafer postures for suppressing the mutual interference of particles will be described.

Figure 22A:
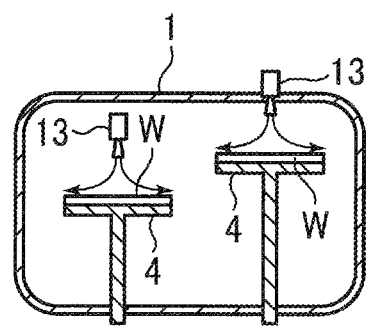
FIG. 22A is a diagram for explaining an example of a desirable wafer posture for suppressing mutual interference of particles.

FIG. 22A illustrates an example in which two wafers W are provided with a difference in elevation. This example may be accomplished by providing a difference in elevation between the two rotary stages 4 by an elevating mechanism. It is possible to reduce the mutual interference of particles, compared to the case where two wafers are horizontally arranged. However, it is necessary to increase the height of the chamber 1, which causes increase in volume of the chamber 1.

Figure 22B:
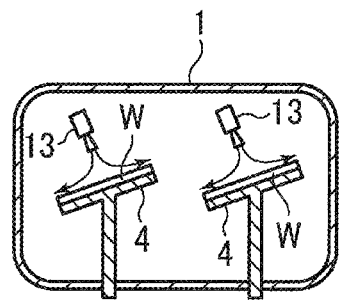
FIG. 22B is a diagram for explaining another example of a desirable wafer posture for suppressing mutual interference of particles.

FIG. 22B illustrates an example in which two wafers W are tilted in the same direction. This example may be implemented by newly providing a tilting mechanism. Depending on the tilt angle, a chuck mechanism is required to hold the wafers W on the rotary stages 4. It is possible to reduce the mutual interference of particles, compared to the case where two wafers are arranged with a difference in elevation.

Figure 22C:
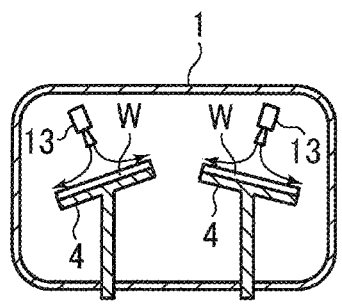
FIG. 22C is a diagram for explaining still another example of a desirable wafer posture for suppressing mutual interference of particles.

FIG. 22C illustrates an example in which two wafers W are tilted in opposite directions. This example may be implemented by newly providing a tilting mechanism. Depending on the tilt angle, a chuck mechanism is required to hold the wafers W on the rotary stages 4. In this case, it is possible to reduce the mutual interference of particles, compared to the case of FIG. 22B.

Figure 22D:
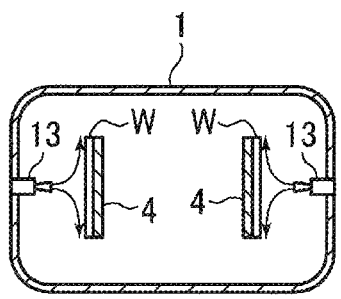
FIG. 22D is a diagram for explaining still another example of a desirable wafer posture for suppressing mutual interference of particles.

FIG. 22D illustrates an example in which two wafers W are arranged vertically on opposite sides. In this case, it is necessary to use, for example, separate rotation mechanisms for the rotary stages 4, and it is necessary to provide chuck mechanisms for holding the wafers W on the rotary stages 4. In this case, it is possible to reduce the mutual interference of particles, compared to the case of FIG. 22C.

Figure 22E:
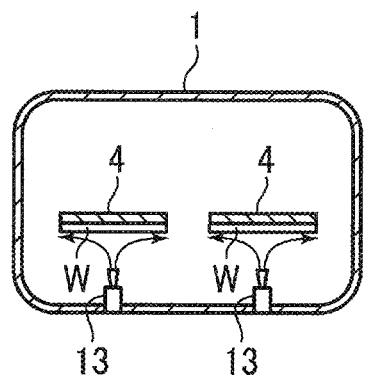
FIG. 22E is a diagram for explaining still another example of a desirable wafer posture for suppressing mutual interference of particles.

FIG. 22E illustrates a case where the wafers W are placed downward on the rotary stages 4. It is necessary to provide mechanisms for reversing the conveyed wafers W and chuck mechanisms for holding the wafers W on the rotary stages 4. In the case where the exhaust port is at the bottom portion of the chamber 1, it is difficult for the particles to adhere to the wafers W by arranging the wafers W downward as described above.

Figure 22F:
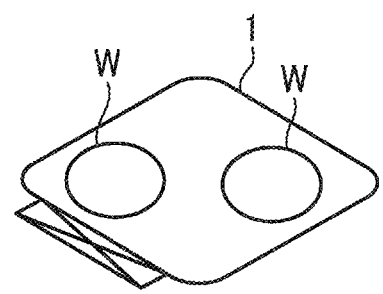
FIG. 22F is a diagram for explaining still another example of a desirable wafer posture for suppressing mutual interference of particles.

In FIG. 22F, the two wafers W are horizontally arranged at the same height, but are arranged to be shifted in the depth direction in the chamber 1. In this case, it is possible to lengthen the distance between the two wafers W. Accordingly, it is possible to reduce the mutual interference of the particles, compared to the case of the first exemplary embodiment. However, the volume of the chamber 1 increases.

Figure 22G:
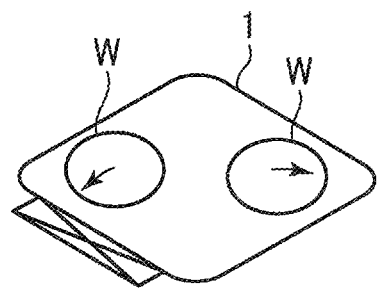
FIG. 22G is a diagram for explaining still another example of a desirable wafer posture for suppressing mutual interference of particles.
Figure 22H:
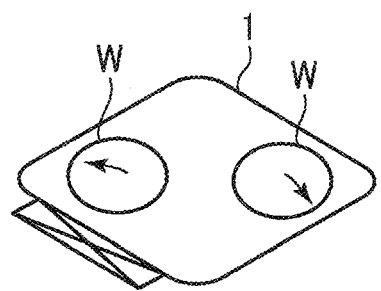
FIG. 22H is a diagram for explaining still another example of a desirable wafer posture for suppressing mutual interference of particles.

FIGS. 22G and 22H illustrate a case where two wafers are arranged in the chamber 1 so as to be shifted in the depth direction similarly to FIG. 22F, and further tilted to opposite sides as in FIG. 22C. Therefore, it is possible to reduce the mutual interference of particles, compared to the case of FIG. 22F. However, similarly to FIG. 22F, the volume of the chamber 1 is increased.

Eighth Exemplary Embodiment

Figure 23:
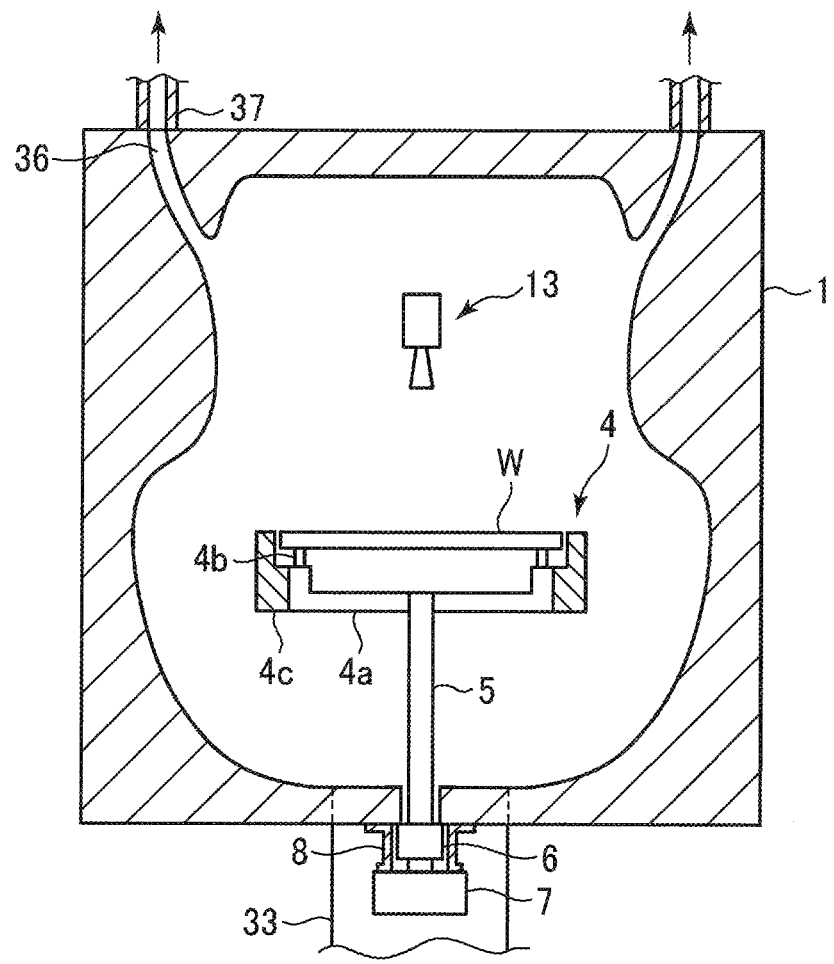
FIG. 23 is a vertical-sectional view illustrating an exemplary substrate cleaning apparatus according to an eighth exemplary embodiment of the present disclosure.

FIG. 23 is a vertical-sectional view illustrating an exemplary substrate cleaning apparatus according to an eighth exemplary embodiment of the present disclosure. In the first to seventh exemplary embodiments, descriptions have been made on a two-sheet substrate cleaning apparatus in which two wafers are placed in a chamber to perform a cleaning processing, but the present disclosure is also applicable to a single wafer cleaning apparatus, which will be described in the present exemplary embodiment by way of an example.

The substrate cleaning apparatus of the present exemplary embodiment is basically configured in the same manner as the substrate cleaning apparatus of the first exemplary embodiment except that it is a single wafer apparatus. Also in the present exemplary embodiment, during the cleaning processing, the blasted position of the gas clusters C is scanned on the wafer W by pivoting the nozzle unit 13 while blasting the gas clusters C from the nozzle unit 13. The scattering direction of the particles removed from the wafer W is determined by the rotation direction of the wafer W and the scanning direction of the gas cluster-blasted position. That is, the scattering direction of the particles removed from the wafer W may be controlled by the rotation direction of the wafer W and the scanning direction of the gas cluster-blasted position.

Since the apparatus of the present exemplary embodiment is a single wafer apparatus, it is unnecessary to consider interference of particles between wafers. However, when the scanning direction of the gas cluster-blasted position and the rotation direction of the wafer are controlled in this manner, it is possible to suppress the removed particles themselves and the particles entrained in the gas stream from re-adhering to the wafer themselves.

Also in the present exemplary embodiment, as in the first exemplary embodiment, the portion of the inner wall of the chamber 1 where the gas stream including particles hits has a curved shape, and it is configured to be exhausted upward from the exhaust port 36. Thus, generation of particles may be suppressed as in the first exemplary embodiment.

Ninth Exemplary Embodiment

Figure 24:
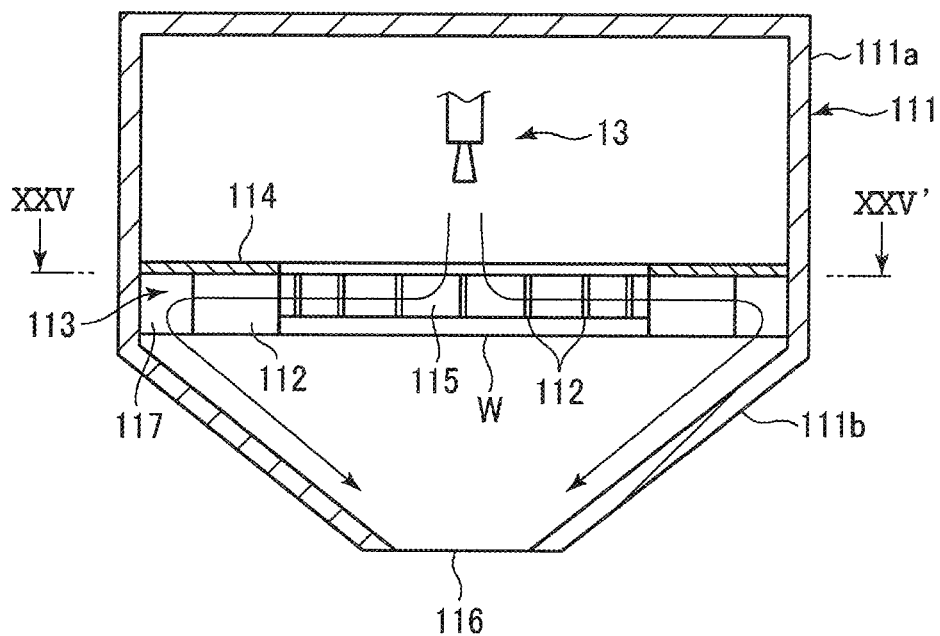
FIG. 24 is a vertical-sectional view illustrating an exemplary substrate cleaning apparatus according to a ninth exemplary embodiment of the present disclosure.
Figure 25:
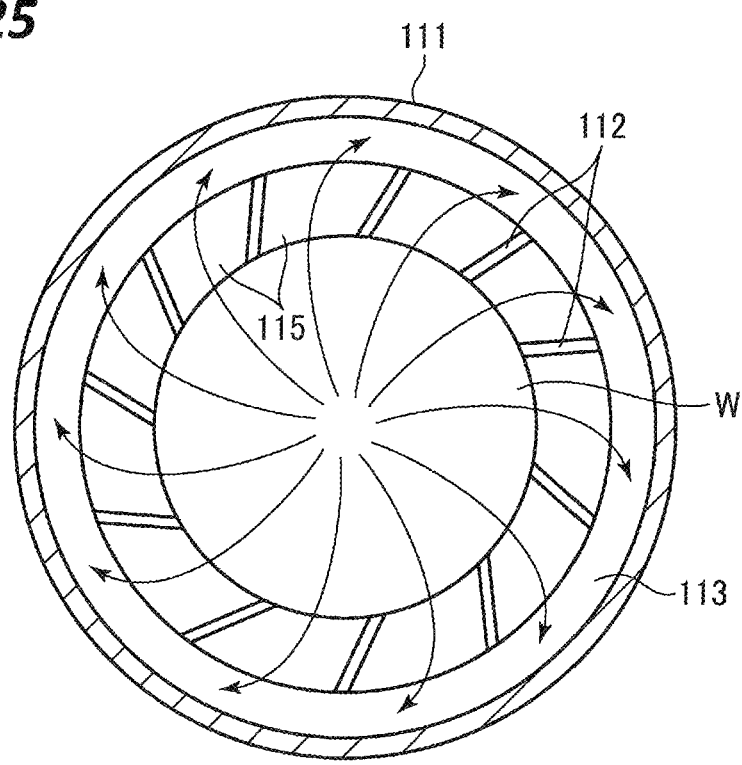
FIG. 25 is a horizontal-sectional view taken along line XXV-XXV' of the substrate cleaning apparatus of FIG. 24.

FIG. 24 is a vertical-sectional view illustrating an exemplary substrate cleaning apparatus according to a ninth exemplary embodiment of the present disclosure. FIG. 25 is a horizontal-sectional view taken along line XXV-XXV' of FIG. 24. In the present exemplary embodiment, the substrate cleaning apparatus has a cyclone type chamber 111 and has a rectifying member 113 provided around a wafer W.

The chamber 111 has a cylindrical upper portion 111a and a conical lower portion 111b, and an exhaust port 116 is provided in the bottom portion of the lower portion 111b. The wafer W is disposed at a portion between the upper portion 111a and the lower portion 111b of the chamber 111 by a rotary stage (not illustrated), and the wafer W and the wall portion of the chamber 111 have a certain interval. The rectifying member 113 is provided in an annular shape along the outer periphery of the wafer W. A plurality of rectifying plates (blades) 112 are provided inside the rectifying member 113 in the circumferential direction in a state of being radially tilted from the wafer side to the outer peripheral side. Further, the upper portion of the rectifying member 113 is closed with an annular cover ring 114. Then, the gas stream above the wafer W is exhausted through a space 115 between the rectifying plates (blades) 112 and an outer space 117 between the wall portion of the chamber 111 and the rectifying member 113 from the exhaust port 116 at the bottom.

When the rectifying member 113 is provided to exhaust the air below the wafer W in this manner, the action of the rectifying member 113 may suppress the gas stream from being wound up above the wafer W. Thus, particles are suppressed from re-adhering to the wafer W. When there is no gap between the rectifying plates (blades) 112 and the wafer, it is possible to obtain a gas stream confining effect.

<Other Applications>

Several exemplary embodiments of the present disclosure have been described above. However, the present disclosure is not limited to the above-described exemplary embodiments, and various modifications may be made within the scope of the present disclosure.

For example, in the above-described exemplary embodiments, the gas cluster-blasted position is scanned by pivotably moving the nozzle unit in the substrate cleaning apparatus. However, the gas cluster-blasted position may be scanned by linearly moving the nozzle unit. In addition, the apparatus configuration including, for example, the mounting position of the nozzle unit, the position of the driving unit, and the position of the exhaust unit is not limited to FIG. 1.

In addition, in the above-described exemplary embodiments, a two-sheet apparatus for cleaning two wafers and a single wafer type apparatus are exemplified, but three or more wafers may be processed. Further, the processing target substrate is not limited to a semiconductor wafer, and it is to be understood that the present disclosure may also be applied to a glass substrate used for a flat panel display (FPD) (e.g., a liquid crystal display device), or other substrates such as a ceramic substrate. Furthermore, the above-described plurality of exemplary embodiments may be implemented arbitrarily in combination.

DESCRIPTION OF SYMBOLS

1: chamber
4: rotary stage
4c: large-diameter ring
5: rotary shaft
6: motor
7: elevating mechanism
10: nozzle moving member
10a: pivot shaft portion
10b: pivot arm
11: driving mechanism
32, 32a, 32b, 32c, 32d, 32e, 32f, 32g, 32h: main exhaust port
33: exhaust pipe
34: vacuum pump
36: upper exhaust port
50: control unit
60: side-flow supply mechanism
70: down-flow supply mechanism
80: baffle plate
90: shield member
100: substrate cleaning apparatus
110: recess
111: chamber
112: rectifying plate (blade)
113: rectifying member
114: cover ring
115: space
116: exhaust port
117: outer space
120: particle
W: semiconductor wafer

The invention claimed is:

1. A substrate cleaning apparatus comprising:
a chamber configured to accommodate a processing target substrate;
a rotary stage configured to rotatably support the processing target substrate in the chamber;
a nozzle configured to blast gas clusters to the processing target substrate supported by the rotary stage to clean the processing target substrate;
a nozzle mover including a pivot arm configured to scan a gas cluster-blasted position of the nozzle along an arced scan trajectory starting at a first peripheral portion of the processing target substrate and ending at a second peripheral portion of the processing target substrate opposite the first peripheral portion along the arced scan trajectory;
an exhaust port configured to evacuate the chamber; and
a controller configured to control an overall operation of the substrate cleaning apparatus, wherein the controller is programmed to:
control a scattering direction of particles to suppress re-adhesion of the particles to the processing target substrate by controlling a rotation direction of the processing target substrate by the rotary stage, and
move the gas cluster-blasted position of the nozzle from the first peripheral portion past a central portion of the processing target substrate to the second peripheral portion.

2. The substrate cleaning apparatus of claim 1, wherein the controller controls the scattering direction of the particles such that the particles are guided to the exhaust port.

3. The substrate cleaning apparatus of claim 1, wherein the controller rotates the processing target substrate in a clockwise direction while moving the gas cluster-blasted position in a clockwise direction along the arced scan trajectory toward the exhaust port, and rotates the processing target substrate in a counterclockwise direction while moving the gas cluster-blasted position of the nozzle in a counterclockwise direction along the arced scan trajectory toward the exhaust port.

4. The substrate cleaning apparatus of claim 1, wherein a portion of an inner wall of the chamber where a gas stream including particles from the processing target substrate hits has a curved shape.

5. The substrate cleaning apparatus of claim 1, wherein the exhaust port includes a main exhaust port provided in a bottom portion of the chamber and configured to evacuate the chamber and an upper exhaust port configured to discharge upward a gas stream in a region of the chamber above the processing target substrate.

6. The substrate cleaning apparatus of claim 1, further comprising:
a transfer port configured to load and unload the processing target substrate into and from the chamber,
wherein the transfer port is provided such that its opening range is shifted from a height position of the processing target substrate on the rotary stage during a cleaning processing.

7. The substrate cleaning apparatus of claim 1, wherein a distance between the nozzle and a wall surface of the chamber is maintained such that a collision speed of a gas stream from the nozzle against the wall surface is 100 m/sec or less.

8. The substrate cleaning apparatus of claim 1, wherein the nozzle mover includes a pivot shaft portion configured to pivot a pivot arm to which the nozzle is attached, and a rotator configured to rotate the pivot shaft portion.

9. The substrate cleaning apparatus of claim 1, further comprising:
a ring disposed on an outer periphery of the processing target substrate.

10. The substrate cleaning apparatus of claim 1, further comprising:
a baffle plate provided at a position lower than the processing target substrate on an inner wall of the chamber.

11. The substrate cleaning apparatus of claim 1, further comprising:
a side-flow supply configured to supply a horizontal side-flow toward the exhaust port into the chamber.

12. The substrate cleaning apparatus of claim 1, further comprising:
a down-flow supply configured to supply a down-flow into the chamber.

13. A substrate cleaning apparatus comprising:
a chamber configured to accommodate a plurality of processing target substrates;
a plurality of rotary stages configured to rotatably support the plurality of processing target substrates, respectively, in the chamber;
a plurality of nozzles configured to blast gas clusters to the plurality of processing target substrates supported by the rotary stages to clean the plurality of processing target substrates, respectively;
a nozzle mover including a plurality of pivot arms configured to scan a gas cluster-blasted position of each respective nozzle along an arced scan trajectory starting at a first peripheral portion of each processing target substrate and ending at a second peripheral portion of each processing target substrate opposite the first peripheral portion along the arced scan trajectory;
an exhaust port configured to evacuate the chamber; and
a controller configured to control an overall operation of the substrate cleaning apparatus,
wherein the controller is programmed to:
control a scattering direction of particles by controlling a rotation direction of each of the processing target substrates by each of the rotary stages, and
move the gas cluster-blasted position of each of the nozzles on each of the processing target substrates from the first peripheral portion of each processing target substrate past a central portion of each processing target substrate to the second peripheral portion of each processing target substrate, thereby suppressing re-adhesion of the particles to the processing target substrates and interference of particles between the plurality of processing target substrates.

14. The substrate cleaning apparatus of claim 13, wherein the controller controls the scattering direction of the particles such that the particles are guided to the exhaust port.

15. The substrate cleaning apparatus of claim 13, wherein the nozzle mover is set so as to enable the gas cluster-blasted position on each of the processing target substrates to draw the scan trajectory toward the exhaust port.

16. The substrate cleaning apparatus of claim 13, wherein a portion of an inner wall of the chamber where a gas stream including particles from each of the processing target substrates hits has a curved shape.

17. The substrate cleaning apparatus of claim 13, wherein the exhaust port includes a main exhaust port provided in a bottom portion of the chamber and configured to evacuate the chamber and an upper exhaust port configured to discharge upward the gas stream in a region of the chamber above the processing target substrates.

18. The substrate cleaning apparatus of claim 13, further comprising:
a transfer port configured to load and unload each of the processing target substrates into and from the chamber, wherein the transfer port is provided such that its opening range is shifted from a height position of each of the processing target substrates on the rotary stages during a cleaning processing.

19. The substrate cleaning apparatus of claim 13, wherein a distance between each of the plurality of nozzles and a wall surface of the chamber is maintained such that a collision speed of the gas stream from the nozzle against the wall surface is 100 m/sec or less.

20. The substrate cleaning apparatus of claim 13, wherein the nozzle mover includes a plurality of pivot arms and a plurality of pivot shafts, each pivot arm connecting a respective pivot shaft to a respective nozzle of the plurality of nozzles, and a rotator configured to rotate each pivot shaft.

21. The substrate cleaning apparatus of claim 13, further comprising:
a ring disposed on an outer periphery of each of the processing target substrates.

22. The substrate cleaning apparatus of claim 13, further comprising:
a baffle plate provided at a position lower than each of the processing target substrates on the inner wall of the chamber.

23. The substrate cleaning apparatus of claim 13, further comprising:
a side-flow supply configured to supply a horizontal side-flow toward the exhaust port into the chamber.

24. The substrate cleaning apparatus of claim 13, further comprising:
a down-flow supply configured to supply a down-flow into the chamber.

25. A substrate cleaning apparatus comprising:
a chamber configured to accommodate two processing target substrates;
two rotary stages configured to rotatably support the two processing target substrates, respectively, in the chamber;
two nozzles configured to blast gas clusters to the two processing target substrates supported by the rotary stages to clean the two processing target substrates, respectively;
a nozzle mover including a plurality of pivot arms configured to scan a gas cluster-blasted position of each respective nozzle along an arced scan trajectory starting at a first peripheral portion of each processing target substrate past a central portion of each processing target substrate and ending at a second peripheral portion of each processing target substrate opposite the first peripheral portion along the arced scan trajectory; and
a main exhaust port provided in a bottom portion of the chamber and configured to evacuate the chamber,
wherein the main exhaust port is solely provided between arrangement positions of the two processing target substrates,
the substrate cleaning apparatus further comprising a controller configured to control an overall operation of the substrate cleaning apparatus, wherein the controller is programmed to:
control a scattering direction of particles to suppress re-adhesion of the particles to the processing target substrates by controlling a rotation direction of the two processing target substrates by the two rotary stages, and
move the gas cluster-blasted position of each of the nozzles from the first peripheral portion past the central portion of each processing target substrate to the second peripheral portion.

26. The substrate cleaning apparatus of claim 25, further comprising:
an upper exhaust port configured to discharge upward the gas stream in a region of the chamber above the processing target substrates.

27. A substrate cleaning apparatus comprising:
a chamber configured to accommodate two processing target substrates;
two rotary stages configured to rotatably support the two processing target substrates, respectively, in the chamber;
two nozzles configured to blast gas clusters to the two processing target substrates supported by the rotary stages to clean the two processing target substrates, respectively;
a nozzle mover including a plurality of pivot arms configured to scan a gas cluster-blasted position of each respective nozzle along an arced scan trajectory starting at a first peripheral portion of each processing target substrate past a central portion of each processing target substrate and ending at a second peripheral portion of each processing target substrate opposite the first peripheral portion along the arced scan trajectory; and
an exhaust port configured to evacuate the chamber,
wherein the two rotary stages are set such that the two processing target substrates are arranged, oriented, or angled to suppress mutual interference of particles,
the substrate cleaning apparatus further comprising a controller configured to control an overall operation of the substrate cleaning apparatus, wherein the controller is programmed to:
control a scattering direction of particles to suppress re-adhesion of the particles to the processing target substrates by controlling a rotation direction of the two processing target substrates by the two rotary stages, and
move the gas cluster-blasted position of each of the nozzles from the first peripheral portion past the central portion of each processing target substrate to the second peripheral portion.

28. A substrate cleaning apparatus comprising:
a chamber configured to accommodate a processing target substrate;
a rotary stage configured to rotatably support the processing target substrate in the chamber;
a nozzle configured to blast gas clusters to the processing target substrate supported by the rotary stage to clean the processing target substrate;
a nozzle mover including a pivot arm configured to scan a gas cluster-blasted position of the nozzle along an arced scan trajectory across, on the processing target substrate; and
an exhaust port configured to evacuate the chamber,
wherein an inner wall of the chamber where a gas stream including particles from the processing target substrate hits has an outwardly protruding R-shaped concave portion.

29. A substrate cleaning apparatus comprising:
a chamber configured to accommodate a processing target substrate;
a rotary stage configured to rotatably support the processing target substrate in the chamber;
a nozzle configured to blast gas clusters to the processing target substrate supported by the rotary stage to clean the processing target substrate;
a nozzle mover including a pivot arm configured to scan a gas cluster-blasted position of the nozzle along an arced scan trajectory starting at a first peripheral portion of the processing target substrate past a central portion of the processing target substrate and ending at a second peripheral portion of the processing target substrate opposite the first peripheral portion along the arced scan trajectory;
a main exhaust port provided in a bottom portion of the chamber and configured to evacuate the chamber; and
an upper exhaust port configured to discharge upward a gas stream in a region of the chamber above the processing target substrate,
the substrate cleaning apparatus further comprising a controller configured to control an overall operation of the substrate cleaning apparatus, wherein the controller is programmed to:
control a scattering direction of particles to suppress re-adhesion of the particles to the processing target substrate by controlling a rotation direction of the processing target substrate by the rotary stage, and
move the gas cluster-blasted position of each of the nozzles from the first peripheral portion past the central portion of the processing target substrate to the second peripheral portion.

30. A substrate cleaning apparatus comprising:
a chamber configured to accommodate a processing target substrate;
a rotary stage configured to rotatably support the processing target substrate in the chamber;
a nozzle configured to blast gas clusters to the processing target substrate supported by the rotary stage to clean the processing target substrate;
a nozzle mover including a pivot arm configured to scan a gas cluster-blasted position of the nozzle along an arced scan trajectory starting at a first peripheral portion of the processing target substrate past a central portion of the processing target substrate and ending at a second peripheral portion of the processing target substrate opposite the first peripheral portion along the arced scan trajectory;
an exhaust port configured to evacuate the chamber; and
a transfer port configured to load and unload the processing target substrate into and from the chamber,
wherein the transfer port is provided such that its opening range is shifted from a height position of the processing target substrate on the rotary stage during a cleaning processing,
the substrate cleaning apparatus further comprising a controller configured to control an overall operation of the substrate cleaning apparatus, wherein the controller is programmed to:
control a scattering direction of particles to suppress re-adhesion of the particles to the processing target substrate by controlling a rotation direction of the processing target substrate by the rotary stage, and
move the gas cluster-blasted position of the nozzle from the first peripheral portion past the central portion of the processing target substrate to the second peripheral portion.

31. A substrate cleaning apparatus comprising:
a chamber configured to accommodate a processing target substrate;

a rotary stage configured to rotatably support the processing target substrate in the chamber;

a nozzle configured to blast gas clusters to the processing target substrate supported by the rotary stage to clean the processing target substrate;

a nozzle mover including a pivot arm configured to scan a gas cluster-blasted position of the nozzle along an arced scan trajectory starting at a first peripheral portion of the processing target substrate past a central portion of the processing target substrate and ending at a second peripheral portion of the processing target substrate opposite the first peripheral portion along the arced scan trajectory; and an exhaust port configured to evacuate the chamber, wherein a distance between the nozzle and a wall surface of the chamber is maintained such that a collision speed of a gas stream from the nozzle against the wall surface is 100 m/sec or less, the substrate cleaning apparatus further comprising a controller configured to control an overall operation of the substrate cleaning apparatus, wherein the controller is programmed to:

control a scattering direction of particles to suppress re-adhesion of the particles to the processing target substrate by controlling a rotation direction of the processing target substrate by the rotary stage, and move the gas cluster-blasted position of the nozzle from the first peripheral portion past the central portion of the processing target substrate to the second peripheral portion.

32. A substrate cleaning apparatus comprising:

a cyclone type chamber including a cylindrical upper portion, a conical lower portion, and an exhaust port positioned at a bottom portion of the conical lower portion, and configured to accommodate a processing target substrate;

a stage configured to support the processing target substrate in the chamber;

a nozzle configured to blast gas clusters to the processing target substrate supported by the stage to clean the processing target substrate; and a rectifying member provided annularly along an outer periphery of the processing target substrate, wherein the rectifying member includes a plurality of rectifying plates provided in a circumferential direction, an upper portion thereof is closed with an annular cover ring, and a gas stream above the processing target substrate is exhausted from the exhaust port through a space between the rectifying plates and an outer space between a wall portion of the chamber and the rectifying member.

* * * * *